(12) United States Patent
Yamaguchi et al.

(10) Patent No.: US 10,475,652 B2
(45) Date of Patent: Nov. 12, 2019

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Hideto Yamaguchi, Toyama (JP); Yukitomo Hirochi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 15/925,080

(22) Filed: Mar. 19, 2018

(65) Prior Publication Data
US 2018/0211840 A1    Jul. 26, 2018

Related U.S. Application Data

(63) Continuation of application No. PCT/JP2015/077308, filed on Sep. 28, 2015.

(51) Int. Cl.
| | |
|---|---|
| *H01L 21/268* | (2006.01) |
| *H01L 21/324* | (2006.01) |
| *H01L 21/78* | (2006.01) |
| *H01L 21/67* | (2006.01) |
| *B23K 101/40* | (2006.01) |

(52) U.S. Cl.
CPC ........ *H01L 21/268* (2013.01); *H01L 21/324* (2013.01); *H01L 21/67109* (2013.01); *H01L 21/67248* (2013.01); *H01L 21/78* (2013.01); *B23K 2101/40* (2018.08)

(58) Field of Classification Search
CPC ............ H01L 21/268; H01L 21/67109; H01L 21/67248; H01L 21/324; H01L 21/78; B23K 2101/40
See application file for complete search history.

(56) References Cited

U.S. PATENT DOCUMENTS

| | | | | |
|---|---|---|---|---|
| 4,854,727 A | * | 8/1989 | Pecot ................... | G01J 5/0003 374/57 |
| 5,305,417 A | * | 4/1994 | Najm ................... | B24B 37/013 118/724 |
| 2012/0201267 A1 | * | 8/2012 | Patalay ................ | G01J 5/0007 374/1 |
| 2018/0269089 A1 | * | 9/2018 | Merchant ............. | G01J 5/0003 |

FOREIGN PATENT DOCUMENTS

JP         2009302177 A  * 12/2009

* cited by examiner

*Primary Examiner* — Syed I Gheyas
(74) *Attorney, Agent, or Firm* — Volpe and Koenig, P.C.

(57) ABSTRACT

There is provided a technology includes: heating a heat insulating plate, which is held by a substrate holder configured to hold a substrate, to a processing temperature, at which the substrate is processed, by an electromagnetic wave supplied from a heating device, and measuring a temperature change of the heat insulating plate until the heat insulating plate reaches the processing temperature; heating the substrate, to the processing temperature and measuring a temperature change of the substrate until the substrate reaches the processing temperature; obtaining a correlation between the temperature change of the heat insulating plate and the temperature change of the substrate and heating the substrate by controlling the heating device based on the temperature of the heat insulating plate and the correlation.

13 Claims, 19 Drawing Sheets

FIG. 9
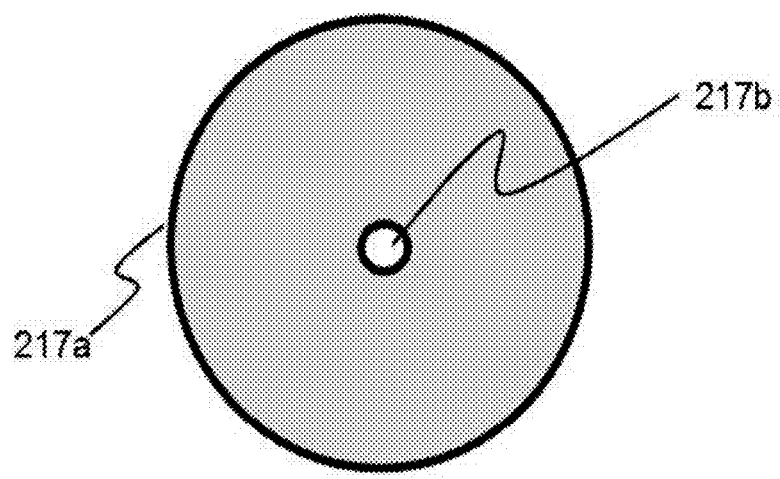
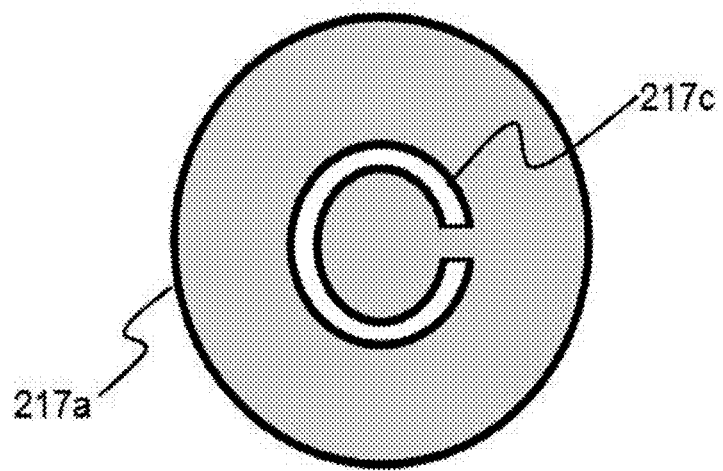

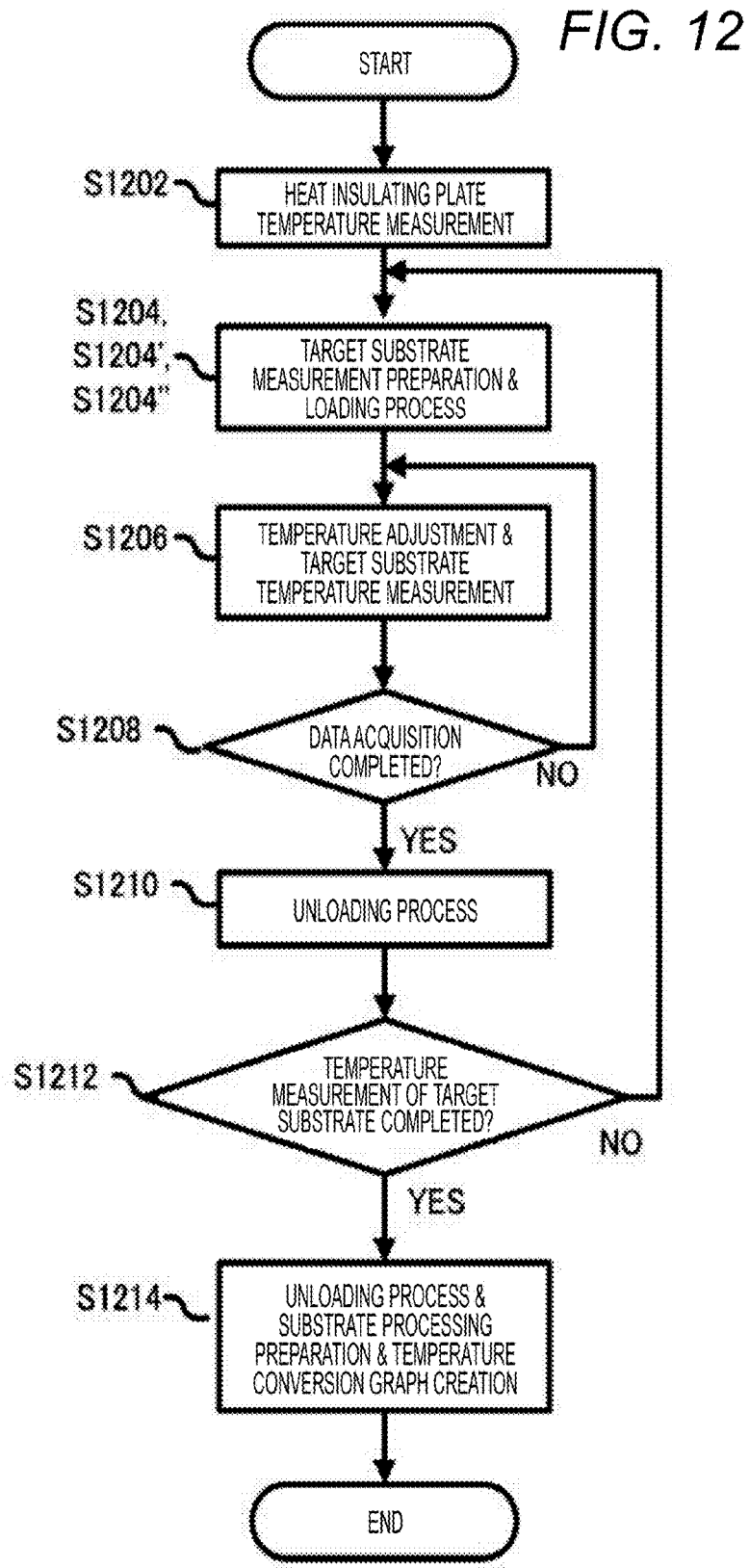

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2015/077308, filed on Sep. 28, 2015, the entire contents of which are incorporated herein by reference.

TECHNICAL FIELD

The present disclosure relates to a method of manufacturing a semiconductor device, a substrate processing apparatus, and a recording medium.

RELATED ART

As one of the processes of manufacturing a semiconductor device, for example, there is an annealing process for heating a substrate in a process chamber by using a heating device and changing a composition or a crystal structure in a thin film formed on the surface of the substrate. As a recent semiconductor device is miniaturized, there is a need for an annealing process on a high-density substrate on which patterns having a high aspect ratio are formed.

SUMMARY

According to an aspect of the present disclosure, there is provided a technology including:

heating a heat insulating plate, which is held by a substrate holder configured to hold a substrate, to a processing temperature, at which the substrate is processed, by an electromagnetic wave supplied from a heating device, and measuring a temperature change of the heat insulating plate by a non-contact type thermometer until the heat insulating plate reaches the processing temperature;

heating the substrate, which is held by the substrate holder, to the processing temperature by the heating device, and measuring a temperature change of the substrate by the non-contact type thermometer until the substrate reaches the processing temperature;

obtaining a correlation between the temperature change of the heat insulating plate and the temperature change of the substrate according to a measurement result of the temperature change of the heat insulating plate and a measurement result of the temperature change of the substrate; and heating the substrate by controlling the heating device based on the temperature of the heat insulating plate measured by the non-contact type thermometer and the correlation.

BRIEF DESCRIPTION OF DRAWINGS

FIG. 9 is a diagram illustrating modification 1 of the first embodiment of the present disclosure.

FIG. 12 is a diagram illustrating a flow of creating a process conversion table that is suitably used in the second embodiment of the present disclosure.

DESCRIPTION OF EMBODIMENTS

First Embodiment of the Present Disclosure

Hereinafter, a first embodiment of the present disclosure will be described with reference to the drawings.

(1) Configuration of Substrate Processing Apparatus

In the present embodiment, a substrate processing apparatus 100 according to the present disclosure is configured as a single-wafer type heat treatment apparatus that performs various heat treatments on wafers.

(Process Chamber)

Figure 1:
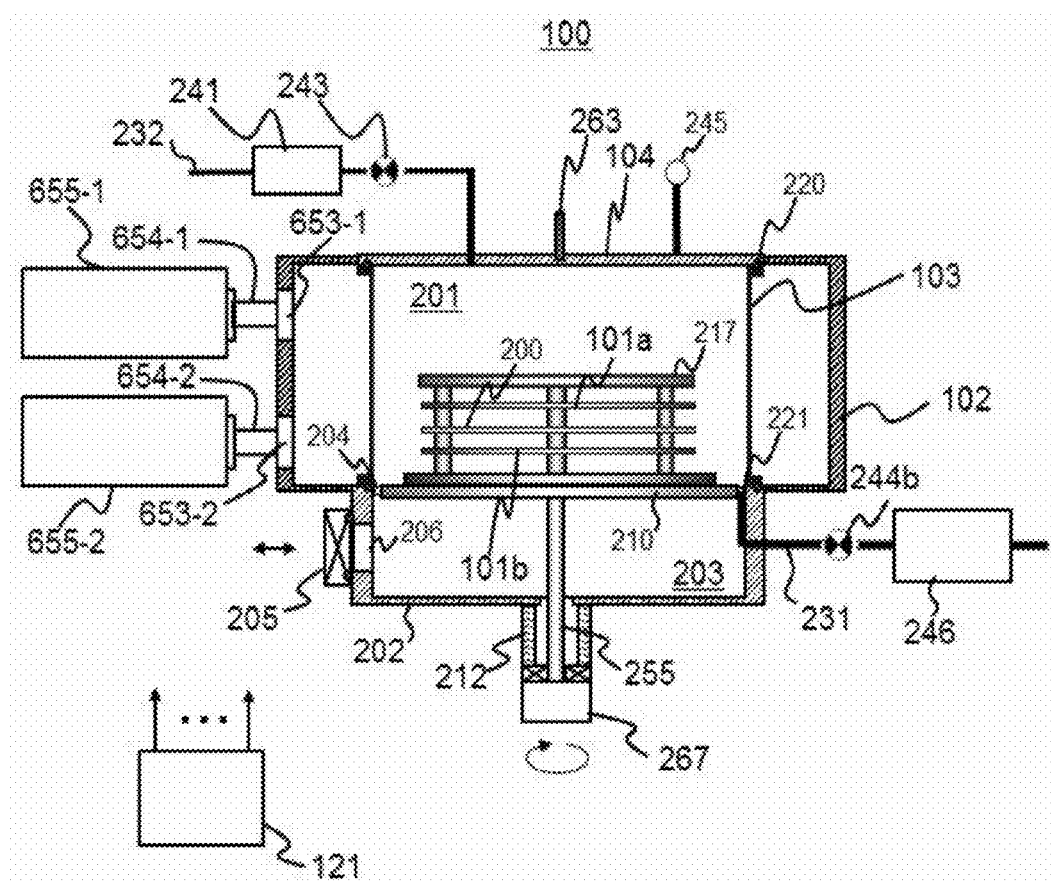
FIG. 1 is a schematic configuration diagram of a single-wafer process furnace of a substrate processing apparatus that is suitably used in a first embodiment of the present disclosure, and is a view illustrating the process furnace portion by a longitudinal sectional view.

As illustrated in FIG. 1, the substrate processing apparatus 100 according to the present embodiment includes a case 102 serving as a cavity made of a material, such as a metal, which reflects an electromagnetic wave, and a reaction tube 103 accommodated in the case 102 and having a cylindrical shape in which upper and lower ends are opened in a vertical direction. The reaction tube 103 is made of a material, such as quartz, which transmits an electromagnetic wave. In addition, a cap flange (closing plate) 104 made of a metal material is brought into contact with the upper end of the reaction tube 103 through an O ring 220 serving as a seal member to close the upper end of the reaction tube. A process container for processing a substrate such as a silicon wafer is configured by, mainly, the case 102, the reaction tube 103, and the cap flange 104, and in particular, an inner space of the reaction tube 103 is configured as the process chamber 201.

A mounting table 210 is provided below the reaction tube 103, and a boat 217 serving as a substrate holder for holding the wafer 200 is mounted on the mounting table 210. In the boat 217, heat insulating plates 101a and 101b for maintaining (keeping) a temperature of the wafer 200 to be processed and the wafer 200 made of, for example, a quartz plate such as a dummy wafer or a silicon plate (Si plate) are held so as to sandwich the wafer 200 therebetween at a predetermined interval. In addition, on the sidewall of the mounting table 210, a protrusion (not illustrated) protruding in a radial direction of the mounting table 210 is provided on the bottom surface side of the mounting table 210. The protrusion approaches or comes in contact with a partition plate 204 provided between the process chamber 201 and a transfer space 203 to be described later, so as to prevent the atmosphere in the process chamber 201 from moving into the transfer space 203, or prevent the atmosphere in the transfer space 203 from moving into the process chamber 201.

Here, a plurality of heat insulating plates 101a and 101b may be provided according to the substrate processing temperature. By providing the plurality of heat insulating plates in this manner, it is possible to suppress the heat radiation of the region where the wafer 200 is mounted, and it is possible to improve the in-plane or inter-plane temperature uniformity of the wafer 200. In addition, as illustrated in FIG. 6 to be described later, a hole 217b serving as a measurement window of a temperature sensor 263 is provided in an endplate (ceiling plate) 217a of the boat 217, and the heat insulating plate 101a is held in the boat 217 such that the temperature sensor 263 measures the surface temperature of the heat insulating plate 101a.

The case 102 serving as an upper container has, for example, a circular cross-section and is configured as a flat closed container. In addition, a transfer container 202 serving as a lower container is made of, for example, a metal material such as aluminum (Al) or stainless steel (SUS), quartz, or the like. Below the process container, the transfer space 203 for transferring the wafer 200 such as a silicon wafer serving as a substrate is formed. A space that is a space surrounded by the case 102 or a space surrounded by the reaction tube 103 and is provided above the partition plate 204 may be referred to as the process chamber 201 or the reaction area 201, and a space that is a space surrounded by the transfer container 202 and is provided below the partition plate 204 may be referred to as a transfer area 203.

A substrate loading/unloading port 206 that is adjacent to a gate valve 205 is provided on the side surface of the transfer container 202, and the wafer 200 moves in a substrate transfer chamber (not illustrated) through the substrate loading/unloading port 206.

On the side surface of the case 102, electromagnetic wave introduction ports 653-1 and 653-2 are drilled. One ends of waveguides 654-1 and 654-2 for supplying a microwave to the process chamber 201 are respectively connected to the electromagnetic wave introduction ports 653-1 and 653-2. Microwave oscillators (electromagnetic wave sources) 655-1 and 655-2 serving as heating sources for heating the process chamber 201 by supplying electromagnetic waves to the process chamber 201 are respectively connected to the other ends of the waveguides 654-1 and 654-2. Here, when making a general explanation or the like, the electromagnetic wave introduction ports 653-1 and 653-2, the waveguides 654-1 and 654-2, and the microwave oscillators 655-1 and 655-2 are represented by the electromagnetic wave introduction port 653, the waveguide 654, and the microwave oscillator 655.

The mounting table 210 is supported by a shaft 255 serving as a rotational shaft. The shaft 255 penetrates the bottom of the transfer container 202, and is further connected to a drive mechanism 267 that performs a rotating operation and a lifting/lowering operation outside the transfer container 202. The wafer 200 mounted on the boat 217 can rotate and move upward or downward by operating the drive mechanism 267 to rotate and move the shaft 255 and the mounting table 210 upward or downward. The periphery of the lower end of the shaft 255 is covered with bellows 212, and the insides of the process chamber 201 and the transfer space 203 are airtightly held.

When the wafer 200 is transferred, the mounting table 210 moves downward such that the upper surface of the mounting table 210 is at a position (wafer transfer position) of the substrate loading/unloading port 206. When the wafer 200 is processed, as illustrated in FIG. 1, the wafer 200 moves upward to a process position (wafer process position) in the process chamber 201.

(Exhaust Portion)

An exhaust portion for exhausting the atmosphere of the process chamber 201 is provided below the process chamber 201 and on the outer peripheral side of the mounting table 210. As illustrated in FIG. 1, an exhaust port 221 is provided in the exhaust portion. An exhaust pipe 231 is connected to the exhaust port 221, and a pressure regulator 244 and a vacuum pump 246 are sequentially connected in series. The pressure regulator 244 may include an APC valve for controlling a degree of valve opening according to a pressure in the process chamber 201.

Here, the pressure regulator 244 is not limited to the APC valve as long as it can receive pressure information in the process chamber 201 (a feedback signal from a pressure sensor 245 to be described later) and adjust an exhaust amount, and a general on-off valve and a General pressure regulation valve may be used in combination.

An exhaust portion (also referred to as an exhaust system or an exhaust line) is configured by, mainly, the exhaust port 221, a reduced pressure system exhaust pipe 231, and the pressure regulator 244. An exhaust path may be provided so as to surround the process chamber 201 and may be configured such that the gas can be exhausted from the entire periphery of the wafer 200. In addition, the vacuum pump 246 may be added to the configuration of the exhaust portion.

(Gas Supply Portion)

The cap flange 104 is provided with a gas supply pipe 232 for supplying process gases for a variety of substrate processing, such as an inert gas, a precursor gas, a reactant gas, and the like into the process chamber 201. A mass flow controller (MFC) 241 that is a flow rate controller (flow rate control portion) and a valve 243 that is an on-off valve are provided in the gas supply pipe 232 in this order from the upstream side. For example, a nitrogen ($N_2$) gas source as an inert gas is connected to the upstream side of the gas supply pipe 232 and supplied into the process chamber 201 through the MFC 241 and the valve 243. In the case of using a plurality of types of gases at the time of substrate processing, a gas supply pipe provided with an MFC serving as a flow rate controller and a valve serving as an on-off valve may be connected downstream of the valve 243 of the gas supply pipe 232 from the upstream direction.

In a case where the inert gas is supplied from the gas supply pipe 232, an inert gas supply system is configured by, mainly, the gas supply pipe 232, the MFC 241, and the valve 243. In addition to the $N_2$ gas, a rare gas, such as an Ar gas, a He gas, a Ne gas, a Xe gas, or the like can also be used as the inert gas.

(Temperature Sensor)

In the cap flange 104, a temperature sensor 263 is provided as a non-contact type temperature detection device. An output of the microwave oscillator 655 to be described later is adjusted based on temperature information detected by the temperature sensor 263, such that the substrate is heated and the substrate temperature has a desired temperature distribution. The temperature sensor 263 is constituted by, for example, a radiation thermometer such as an infrared radiation (IR) sensor.

The method of measuring the temperature of the substrate is not limited to the above-described radiation thermometer. The temperature measurement may be performed by using a thermocouple, or the temperature measurement may be performed by using both the thermocouple and the radiation thermometer. However, when the temperature measurement is performed by using the thermocouple, it is necessary to perform the temperature measurement by arranging the thermocouple in the vicinity of the processed wafer 200 so as to improve the temperature measurement accuracy of the thermocouple. Therefore, it is preferable to use the radiation thermometer as the temperature sensor 263 because the thermocouple itself is heated by a microwave supplied from a microwave oscillator to be described later.

In addition, the temperature sensor 263 is not limited to being provided on the cap flange 104, and may be provided on the mounting table 210. With this configuration, it is possible to use the reaction tube of which the upper end is closed, and it is possible to reduce the possibility of leakage of microwaves, process gases, and the like supplied to the process chamber 201.

In addition, the temperature sensor 263 may be not only directly provided on the cap flange 104 or the mounting table 210, but also may indirectly measure radiation light from the measurement window provided on the cap flange 104 or the mounting table 210 by reflecting the radiation light with a mirror or the like. With this configuration, it is possible to relax the restriction on the place where the temperature sensor 263 is provided.

(Microwave Oscillator)

The electromagnetic wave introduction ports 653-1 and 653-2 are provided on the sidewall of the case 102. One ends of the waveguides 654-1 and 654-2 for supplying an electromagnetic wave to the process chamber 201 are respectively connected to the electromagnetic wave introduction ports 653-1 and 653-2. The microwave oscillators (electromagnetic wave sources) 655-1 and 655-2 serving as the heating sources for heating the process chamber 201 by supplying electromagnetic waves to the process chamber 201 are respectively connected to the other ends of the waveguides 654-1 and 654-2. The microwave oscillators 655-1 and 655-2 supply electromagnetic waves, such as microwaves, to the waveguides 654-1 and 654-2, respectively. In addition, as the microwave oscillators 655-1 and 655-2, magnetron, klystron, or the like is used. A frequency of the electromagnetic wave generated by the microwave oscillator 655 is preferably controlled to be in a frequency range of 13.56 MHz to 24.125 GHz. More preferably, it is controlled to have a frequency of 2.45 GHz or 5.8 GHz.

In the present embodiment, two microwave oscillators 655 are described as being disposed on the side surface of the case 102, but the present disclosure is not limited thereto, and at least one microwave oscillator 655 may be provided.

In addition, the microwave oscillators 655 may be arranged so as to be provided on different side surfaces such as opposite side surfaces of the case 102. With this configuration, it is possible to suppress the region in which the microwave to be described later is partially absorbed on the wafer 200, that is, it is possible to suppress the wafer 200 from being partially heated, and thus the in-plane temperature uniformity of the wafer 200 can be improved.

A heating device serving as an electromagnetic wave supply portion (electromagnetic wave supply device, microwave supply portion, microwave supply device) is configured by, mainly, the microwave oscillators 655-1 and 655-2, the waveguides 654-1 and 654-2, and the electromagnetic wave introduction ports 653-1 and 653-2.

A controller 121 to be described later is connected to each of the microwave oscillators 655-1 and 655-2. The heat insulating plate 101a or 101b accommodated in the process chamber 201 or the temperature sensor 263 for measuring the temperature of the wafer 200 is connected to the controller 121. The temperature sensor 263 measures the temperature of the heat insulating plate 101a or 101b or the wafer 200, and transmits the measured temperature to the controller 121. The controller 121 controls the output of the microwave oscillators 655-1 and 655-2, and controls the heating of the wafer 200.

Here, the microwave oscillators 655-1 and 655-2 are controlled by the same control signal transmitted from the controller 121. However, the present disclosure is not limited thereto, and the microwave oscillators 655-1 and 655-2 may be individually controlled by transmitting individual control signals from the controller 121 to each of the microwave oscillators 655-1 and 655-2.

(Control Device)

Figure 2:
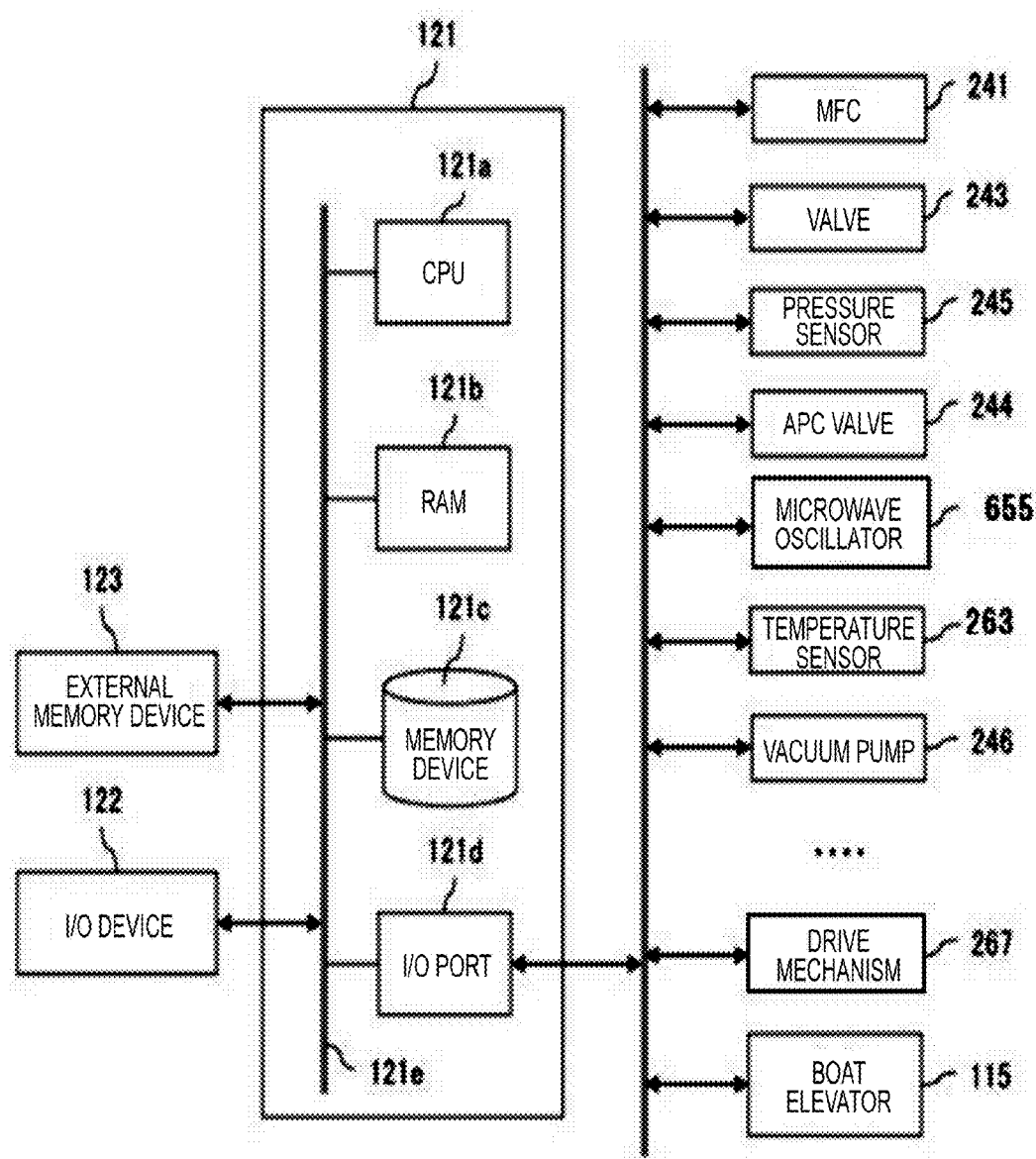
FIG. 2 is a schematic configuration diagram of a controller of a substrate processing apparatus that is suitably used in the present disclosure.

As illustrated in FIG. 2, the controller 121 that is a control portion (control device) is configured by a computer that includes a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a through an internal bus 121e. An I/O device 122, which is configured as, for example, a touch panel or the like, is connected to the controller 121.

The memory device 121c is configured by, for example, a flash memory, a hard disk drive (HDD), or the like. In the memory device 121c, a control program for controlling the operation of the substrate processing apparatus, an etching recipe, a process recipe, and the like in which a procedure or condition of a nozzle etching process or a film forming process to be described later are described are stored in a readable manner. The etching recipe or the process recipe is a combination of procedures of a substrate processing process to be described later so as to obtain a desired result when the procedures are performed by the controller 121, and functions as a program. Hereinafter, the process recipe, the control program, and the like will be simply and collectively referred to as a program. In addition, the etching recipe or the process recipe is simply referred to as a recipe. When the term "program" is used in the present disclosure, it should be understood as including a recipe alone, a control program alone, or both of the recipe and the control program. The RAM 121b is configured as a memory area (work area) in which a program or data read by the CPU 121a is temporarily retained.

The I/O port 121d is connected to the MFCs 241a to 241d, the valves 243a to 243d, the pressure sensor 245, the APC valve 244, the vacuum pump 246, the temperature sensor 263, the drive mechanism. 267, the microwave oscillator 655, and the like.

The CPU 121a is configured to read and execute the control program from the memory device 121c and to read the recipe from the memory device 121c according to an input of an operation command from the I/O device 122, or the like. The CPU 121a is configured to control the operation of adjusting the flow rates of various gases by the MFCs 241a to 241d, the operation of opening and closing the valves 243a to 243d, the operation of opening and closing the APC valve 244, the operation of adjusting the pressure by the APC valve 244 based on the pressure sensor 245, the start and stop of the vacuum pump 246, the operation of adjusting the output of the microwave oscillator based on the temperature sensor 263, the operation of adjusting the rotation and the rotating speed of the mounting table 210 (or the boat 217) by the drive mechanism 267, the elevating operation, or the like according to the contents of the read recipe.

The controller 121 can be configured by installing, on a computer, the program stored in an external memory device (for example, a magnetic tape, a magnetic disk such as a flexible disk or a hard disk, an optical disk such as a CD or a DVD, a magneto-optical disk such as an MO, or a semiconductor memory such as a USB or a memory card) 123. The memory device 121c or the external memory device 123 is configured as a non-transitory computer-readable recording medium. Hereinafter, the memory device 121c and the external memory device 123 may be simply and collectively referred to as a recording medium. When the term "recording medium" is used in the present disclosure, it may be understood as including the memory device 121c alone, the external memory device 123 alone, or both of the memory device 121c and the external memory device 123. The provision of the program to the computer may be performed by using communication means, such as the Internet, dedicated lines, or the like, without using the external memory device 123.

(2) Substrate Processing Process

Next, as one of the processes of manufacturing the semiconductor device by using the process furnace of the above-described substrate processing apparatus 100, for example, an example of a method of reforming (crystallizing) an amorphous silicon film as a silicon-containing film formed on a substrate will be described along a processing flow illustrated in FIG. 3. In the following description, the operations of the respective components constituting the substrate processing apparatus 100 are controlled by the controller 121.

When the term "wafer" is used in the present disclosure, it may be understood as meaning "a wafer itself (product wafer)", "a laminate (aggregate) of a wafer and a predetermined layer or film formed on a surface thereof", that is, a wafer including a predetermined layer or film formed on a surface thereof, or "a target substrate (target wafer)" to be described later or "a dummy substrate (dummy wafer)" or "both of a target substrate (target wafer) and a dummy substrate (dummy wafer) " to be described later. In addition, when the term "a surface of a wafer" is used in the present disclosure, it may be understood as meaning "a surface (exposed surface) of a wafer itself" by using the definition of the "wafer" or "a surface of a predetermined layer or film formed on a wafer, that is, an uppermost surface of a wafer as a laminate".

Thus, when the term "a predetermined gas is supplied to a wafer" is used in the present disclosure, it may be understood as meaning that "a predetermined gas is supplied to a surface (exposed surface) of a wafer itself" by using the definition of the "wafer" or that "a predetermined gas is supplied to a layer or film formed on a wafer, that is, an uppermost surface of a wafer as a laminate". In addition, when the term "a predetermined layer (or film) is formed on a wafer" is used in the present disclosure, it may be understood as meaning that "a predetermined layer (or film) is formed on a surface (exposed surface) of a wafer itself" or that "a predetermined layer (or film) is formed on a layer or film formed on a wafer, that is, an uppermost surface of a wafer as a laminate".

In addition, the case where the term "substrate" is used in the present disclosure is the same as the case where the term "wafer" is used.

Figure 8:
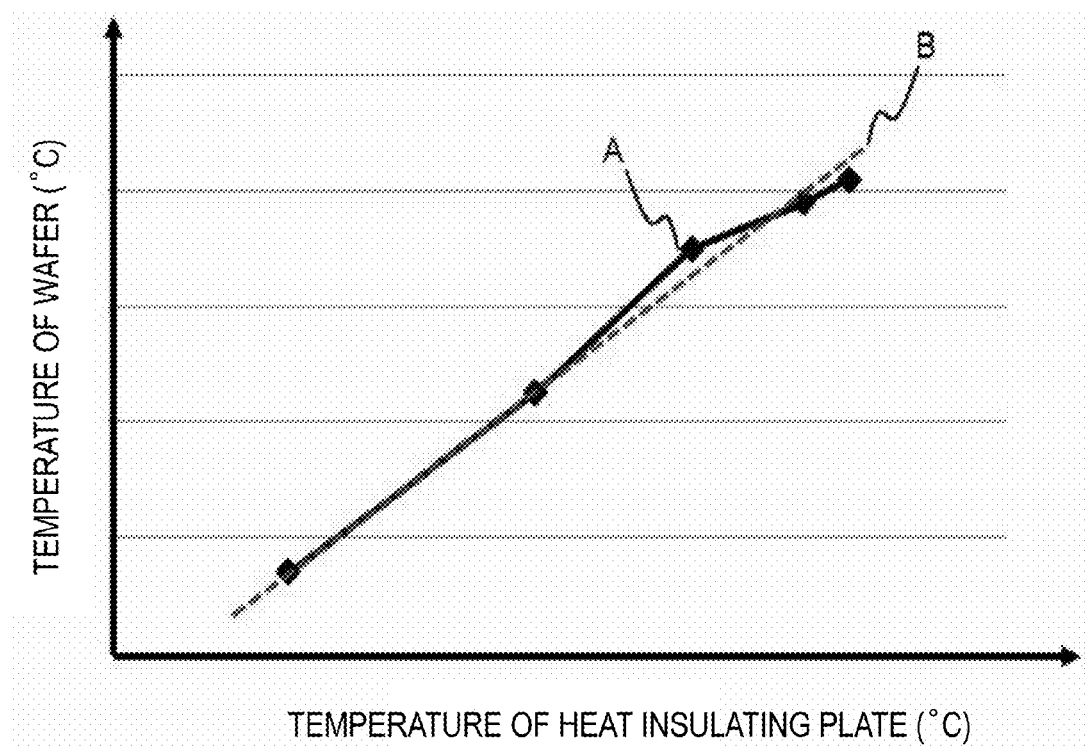
FIG. 8 is a temperature conversion graph illustrating a correlation between a heat insulating plate and a target substrate, which are formed from the graph of the heat insulating plate and the target substrate in FIG. 7.

(Temperature Conversion Graph Creating Process (S302)) As a preliminary stage of performing a predetermined substrate processing, an acquisition process of data creating a temperature conversion graph is performed by using the heat insulating plate 101a, the temperature sensor 263, the target substrate 601, and the perforated heat insulating plate 602, as illustrated in FIG. 8 that illustrates a correlation between the heat insulating plate 101a and the wafer 200 (S302).

(Loading Process (S304))

Figure 3:
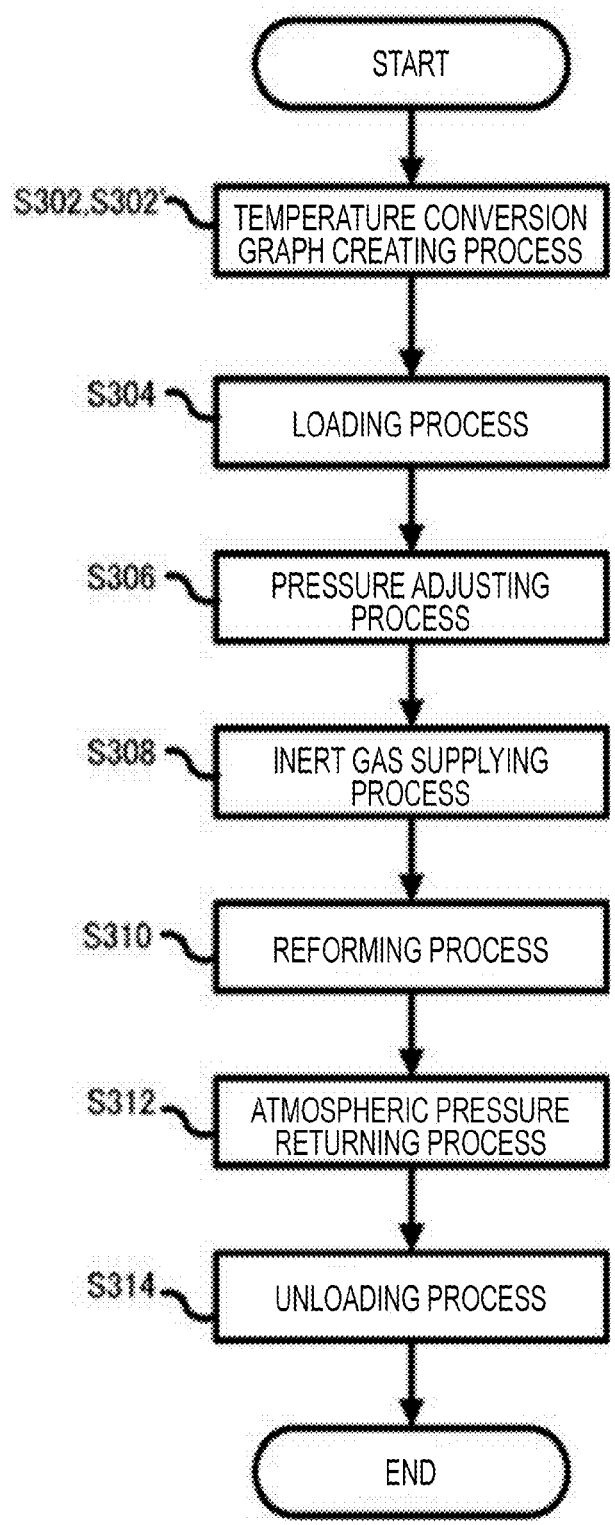
FIG. 3 is a diagram illustrating a flow of substrate processing in the present disclosure.

As illustrated in FIG. 1, when a predetermined number of wafers 200 are transferred to a boat 217, a boat elevator 115 lifts the boat 217 such that the boat 217 is loaded into the process chamber 201 inside the reaction tube 103 (boat loading) as illustrated in FIG. 3 (S304).

(Pressure Adjusting Process (S306))

When the loading of the boat 217 into the process chamber 201 is completed, the atmosphere in the process chamber 201 is exhausted such that the inside of the process chamber 201 has a predetermined pressure (for example, 10 Pa to 100 Pa). Specifically, while the atmosphere is exhausted by the vacuum pump 246, the degree of valve opening of the pressure regulator 244a or 244b is feedback-controlled based on pressure information detected by the pressure sensor 245, such that the inside of the process chamber 201 is set to a predetermined pressure (S306).

(Inert Gas Supplying Process (S308))

The drive mechanism 267 rotates the wafer 200 through the boat 217. At this time, an inert gas such as nitrogen gas is supplied from the nozzle 249 through the gas supply pipe 232 (S308). The pressure in the process chamber 201 is adjusted to a predetermined value within a range of 0 Pa to 200,000 Pa, for example, 0 Pa to 300 Pa (G).

(Reforming Process (S310))

The microwave oscillators 655-1 and 655-2 heat the wafer 200 to a temperature range of 100° C. to 900° C., for example 400° C. The temperature of the wafer 200 is controlled such that a surface temperature of a quartz susceptor 101a is measured by the temperature sensor 263 and estimated by creation data of the temperature conversion graph stored in the temperature conversion graph creating process. The microwave oscillators 655-1 and 655-2 supply microwaves from the electromagnetic wave introduction ports 653-1 and 653-2 into the process chamber 201 through the waveguides 654-1 and 654-2. Since the microwaves supplied into the process chamber 201 are incident on the wafer 200 and efficiently absorbed, it is possible to extremely effectively increase the temperature of the wafer 200.

Figure 4A:
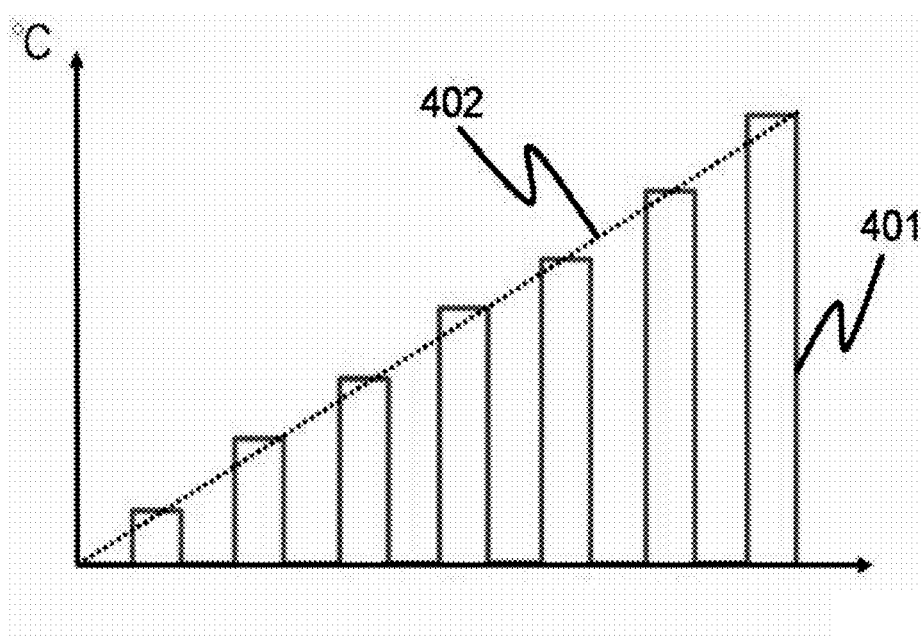
FIG. 4A is a diagram illustrating a temperature transition by temperature control in the present disclosure, and is a graph illustrating a transition of temperature and time by temperature control at the time of a temperature rise.

Here, when the temperature of the wafer 200 increases, it is preferable that the microwave oscillators 655-1 and 655-2 are controlled so as to increase the outputs of the microwave oscillators 655-1 and 655-2 while intermittently supplying microwaves. That is, as illustrated in FIG. 4A, it is preferable to combine a pulse control 401 for intermittently supplying the microwaves from the microwave oscillators 655-1 and 655-2 and a power limit control 402 for linearly controlling the outputs of the microwave oscillators 655-1 and 655-2.

Figure 4B:
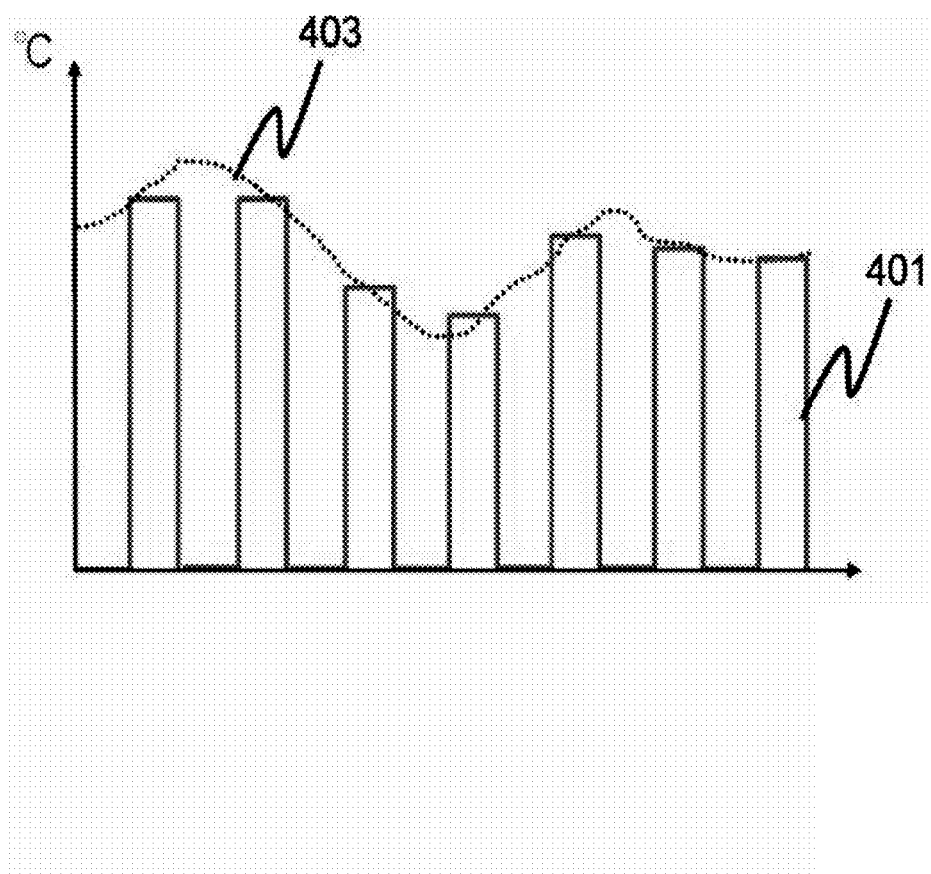
FIG. 4B is a diagram illustrating a temperature transition by temperature control in the present disclosure, and is a graph illustrating a transition of temperature and time by temperature control at the time of substrate processing.
Figure 4C:
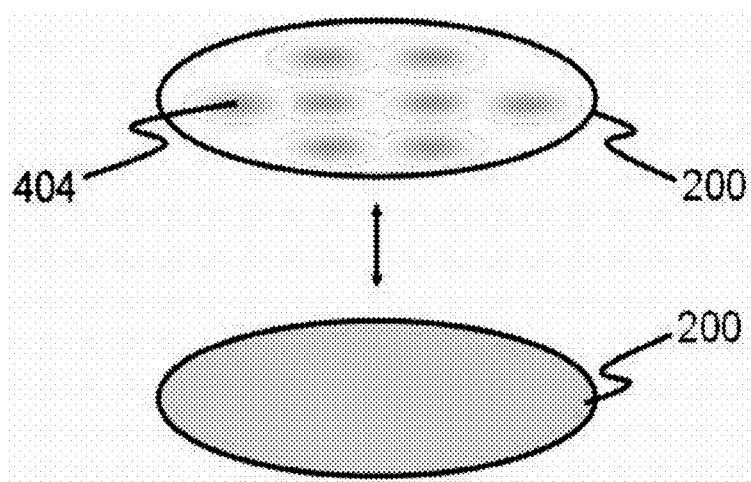
FIG. 4C is a schematic diagram illustrating a heating region of a wafer by temperature control at the time of substrate processing in the present disclosure.
Figure 5:
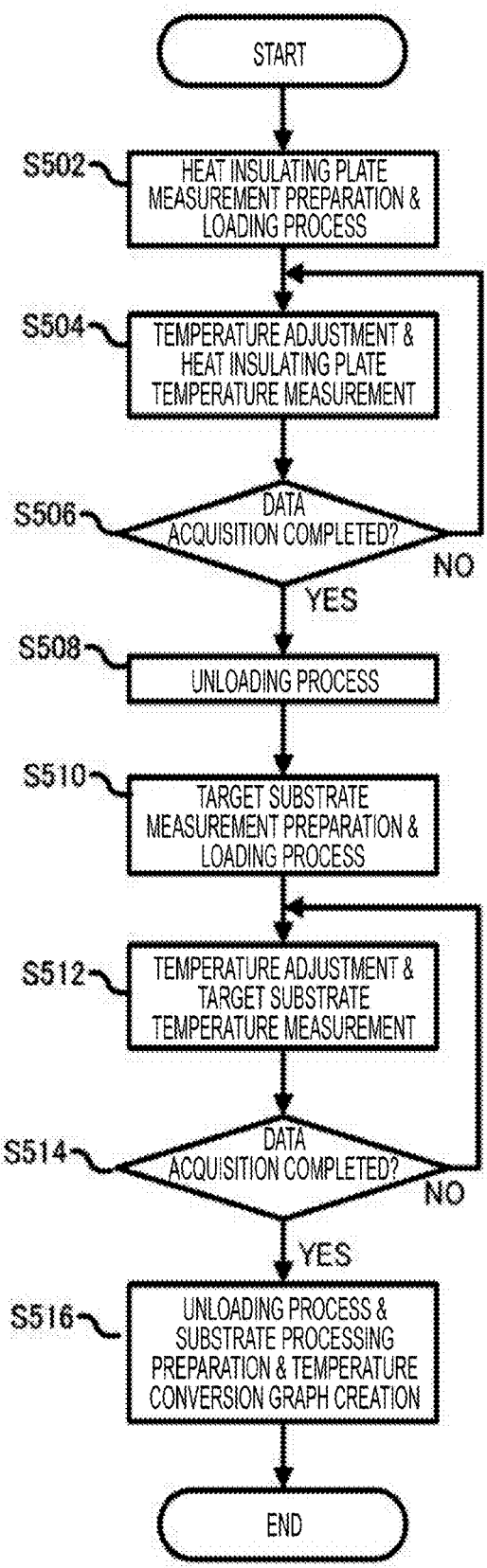
FIG. 5 is a diagram illustrating a flow of creating a process conversion table that is suitably used in the first embodiment of the present disclosure.

By supplying the microwaves in a pulse control manner at the time of increasing the temperature of the wafer 200, as illustrated in FIG. 4C, it is possible to provide a time (OFF time) during which no microwaves are supplied even if a region (microwave concentrated region, hot spot) 404 in which a stationary wave is formed in the process chamber 201 and is concentrated and heated on the surface of the wafer is formed. By providing a timing that does not supply microwaves, heat generated in the microwave concentrated region 404 is transmitted to the entire surface of the wafer 200, and the in-plane temperature of the wafer 200 can be uniformly maintained. By providing a period during which heat transfer occurs in the in-plane of the wafer 200 in this manner, it is possible to suppress the microwave concentrated region 404 from being heated in a concentrated manner.

Therefore, by supplying the microwaves in a pulse control manner, it is possible to prevent a temperature difference between the microwave concentrated region 404 and the other wafer surfaces from increasing because the microwave concentrated region 404 is heated in a concentrated manner. That is, since the microwave concentrated region 404 is intensively and continuously heated, a temperature difference occurs on the surface of the wafer 200, so that it is possible to suppress wafer deformation such as cracking, warping, or distortion of the wafer 200. In addition, by supplying the microwaves in a power limit control manner at the time of increasing the temperature of the wafer 200, it is possible to efficiently increase the temperature of the wafer 200, and it is possible to heat the wafer 200 to a desired substrate processing temperature in a short time.

Next, when the increasing of the temperature of the wafer 200 is completed, the microwave oscillators 655-1 and 655-2 are controlled so as to maintain the temperature measured by the temperature sensor 263 within a predetermined range as the substrate processing temperature. Specifically, the temperature measured by the temperature sensor 263 is converted based on the temperature conversion graph illustrated in FIG. 8 created in the temperature conversion graph creating process (S302), and the temperature control is performed.

At this time, as illustrated in FIG. 4B, the temperature measured by the temperature sensor 263 is fed back to the controller 121, and a feedback control 403 for controlling the microwave oscillators 655-1 and 655-2 is performed based on the fed-back data, and the pulse control is performed similarly to the case of increasing the temperature of the wafer, such that the substrate processing temperature is within a predetermined range. By executing a control in this manner, it is possible to maintain the temperature of the wafer 200 at a substrate processing temperature within a predetermined range. The reason for performing the pulse control is the same reason as when increasing the temperature of the wafer.

Here, it is preferable that an interval (that is, pulse width) between the time (ON time) when the microwaves are supplied by the microwave oscillators 655-1 and 655-2 and the time (OFF time) when the microwave are not supplied can be controlled at an interval of, for example, $1 \times 10^{-4}$ sec. With this configuration, an accurate temperature control can be performed both during the wafer temperature rise and during the wafer processing.

It should be noted that the control may be executed such that pulse widths are different between the wafer temperature rise and the wafer processing. With this configuration, it is possible to improve the in-plane temperature uniformity by decreasing the pulse width at the time of the wafer temperature rise in which the temperature difference between the microwave concentrated region 404 and the other surfaces on the surface of the wafer 200 tends to be large (regions other than the microwave concentrated region are not heated). Similarly, it is possible to sufficiently irradiate the surface of the wafer with the microwaves and to perform sufficient wafer processing by increasing the pulse width at the time of the wafer processing in which the temperature difference between the microwave concentrated region 404 and the other surfaces on the surface of the wafer 200 is hardly increased (regions other than the microwave concentrated region are heated to some extent).

In addition, the time intervals between the ON time and the OFF time of the pulse width may be controlled to be different from each other.

As described above, the amorphous silicon film formed on the surface of the wafer 200 is reformed (crystallized) into a polysilicon film by heating the wafer 200. That is, the wafer 200 can be uniformly reformed.

When a preset processing time has elapsed, the rotation of the boat 217, the supply of the gas, the supply of the microwaves, and the exhaust of the exhaust pipe are stopped (S310).

(Atmospheric Pressure Returning Process (S312))

After the completion of the reforming process, an inert gas such as an $N_2$ gas is supplied to return the pressure in the process chamber 201 to the atmospheric pressure (S312).

(Unloading Process (S314))

After returning the pressure in the process chamber 201 to the atmospheric pressure, the drive mechanism 267 lowers the mounting table 210 to open the furnace throat and unload the boat 217 to the transfer space 203 (boat unloading). After that, the wafer 200 mounted on the boat 217 is unloaded to the transfer chamber positioned outside the transfer space 203 (S314).

By repeating the above operation, the wafer 200 is reformed.

(3) Temperature Conversion Graph Creating Process

Next, the detailed processing flow of the temperature conversion graph creating process S302 will be described with reference to FIGS. 5 to 8. In the present disclosure, the description will be given as a temperature conversion rough creating process in order to facilitate the understanding of the description, but it is not always necessary to prepare a temperature conversion graph as long as it is possible to acquire data capable of creating the temperature conversion graph.

(Heat Insulating Plate Measurement Preparation and Loading Process (S502))

Figure 6A:
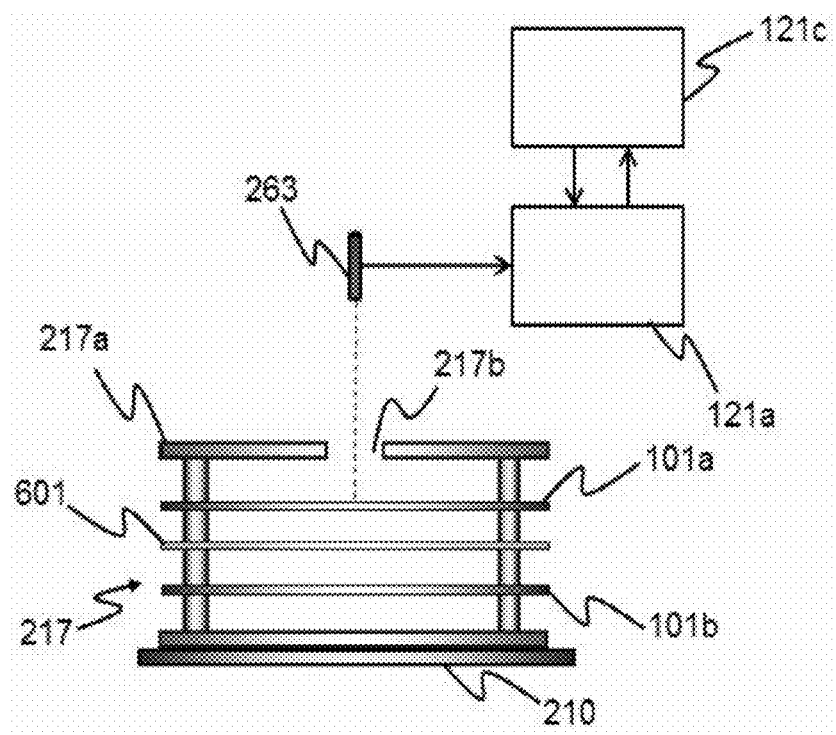
FIG. 6A is a diagram illustrating a temperature measuring method when creating a process conversion table that is suitably used in the first embodiment of the present disclosure, and is a diagram when a temperature of a heat insulating plate is measured.

As illustrated in FIG. 6A, the hole 217b serving as the measurement window of the temperature sensor 263 is provided in the endplate (ceiling plate) 217a of the boat 217, and the heat insulating plate 101a is held in the boat 217 such that the temperature sensor 263 measures the surface temperature of the heat insulating plate 101a. Similarly, the dummy substrate (dummy wafer) 601 and the heat insulating plate 101b are held by the boat 217. A material of the dummy substrate (dummy wafer) 601 may be different from or same as that of the wafer 200 (product wafer) on which the substrate processing is performed, and thermal characteristics of the dummy substrate (dummy wafer) 601 and the wafer 200 (product wafer) are similar to each other. When the heat insulating plates 101a and 101b and the dummy wafer 601 are held at predetermined positions of the boat 217, the boat 217 is loaded into the process chamber 201 (S502).

(Temperature Adjustment and Heat Insulating Plate Temperature Measurement (S504))

When the boat 217 is loaded into a predetermined substrate processing position, the microwave is supplied from the microwave oscillator 655, and the microwave oscillator 655 is controlled by the above-described control method so as to perform temperature adjustment such as the increase in the temperature of wafer 200 up to the substrate processing temperature and the temperature maintenance. While the temperature adjustment is performed, the surface temperature of the heat insulating plate 101a is measured for a predetermined time by the temperature sensor 263 at a predetermined start timing (S504).

The temperature of the heat insulating plate 101a measured by the temperature sensor 263 is stored in the memory device 121c through the CPU 121a. The microwave supplied from the microwave oscillator 655 is also stored in the memory device 121c through the CPU 121a. The stored data can be visualized as illustrated in, for example, the graph 701 of FIG. 7.

(Data Acquisition Completion Determination (S506))

When the temperature sensor 263 measures the surface temperature of the heat insulating plate 101a for a predetermined time, the controller 121 determines whether predetermined data can be acquired (S506). If the acquisition of the predetermined data is completed, the process proceeds to a next step, and if not completed, the temperature adjustment and heat insulating plate temperature measurement S504 is performed again.

(Unloading Process (S508))

When the acquisition of the predetermined data of the heat insulating plate 101a is completed, the boat 217 is unloaded (S508).

(Target Substrate Measurement Preparation and Loading Process (S510))

Figure 6B:
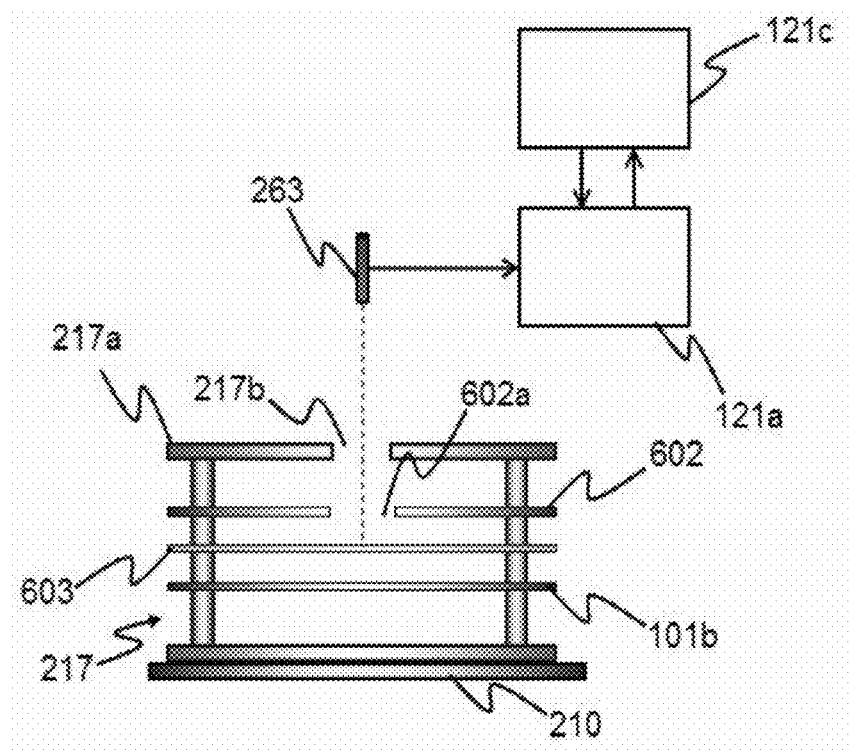
FIG. 6B is a diagram illustrating a temperature measuring method when creating a process conversion table that is suitably used in the first embodiment of the present disclosure, and is a diagram when a temperature of a target substrate is measured.

When the boat 217 is unloaded, the heat insulating plate 101a is taken out from the boat 217 as illustrated in FIG. 6B, and the perforated heat insulating plate 602 is held at the position where the heat insulating plate 101a was held. Similarly, after the dummy wafer 601 is unloaded, the target substrate (target wafer) 603 made of a material having thermal characteristics more similar to the product wafer than the dummy wafer is held in the boat 217. When the perforated heat insulating plate 602 and the target wafer 603 are respectively held at the predetermined positions of the boat 217, the boat 217 is loaded into the process chamber 201 (S510).

(Temperature Adjustment and Target Substrate Temperature Measurement (S512))

As in the case of measuring the temperature of the heat insulating plate 101a, when the boat 217 is loaded into a predetermined substrate processing position, the microwave is supplied from the microwave oscillator 655, and the microwave oscillator 655 is controlled by the above-described control method so as to perform temperature adjustment such as the increase in the temperature of wafer 200 up to the substrate processing temperature and the temperature maintenance. While the temperature adjustment is performed, the surface temperature of the target wafer 603 is measured for a predetermined time by the temperature sensor 263 at a predetermined start timing (S512).

(Data Acquisition Completion Determination (S514))

When the temperature sensor 263 measures the temperature of the target wafer for a predetermined time, the controller 121 determines whether predetermined data can be acquired (S514). If the acquisition of the predetermined data is completed, the process proceeds to a next step, and if not completed, the temperature adjustment and target substrate temperature measurement S512 is performed again.

The temperature of the target wafer 603 measured by the temperature sensor 263 is stored in the memory device 121c through the CPU 121a. The microwave supplied from the microwave oscillator 655 is also stored in the memory device 121c through the CPU 121a. The stored data can be visualized as illustrated in, for example, the graph 702 of FIG. 7.

(Unloading Process, Substrate Processing Preparation, and Temperature Conversion Graph Creation (S516))

When the acquisition of the predetermined data of the target wafer 603 is completed, the boat 217 is unloaded. After the boat 217 is unloaded, the perforated heat insulating plate 602 is taken out, and the heat insulating plate 101a is placed on the boat 217 as illustrated in FIG. 1. In addition, the target wafer 603 is taken out and the normal wafer 200 is placed on the boat 217. In this way, the preparation for executing the substrate processing flow is performed.

Figure 7:
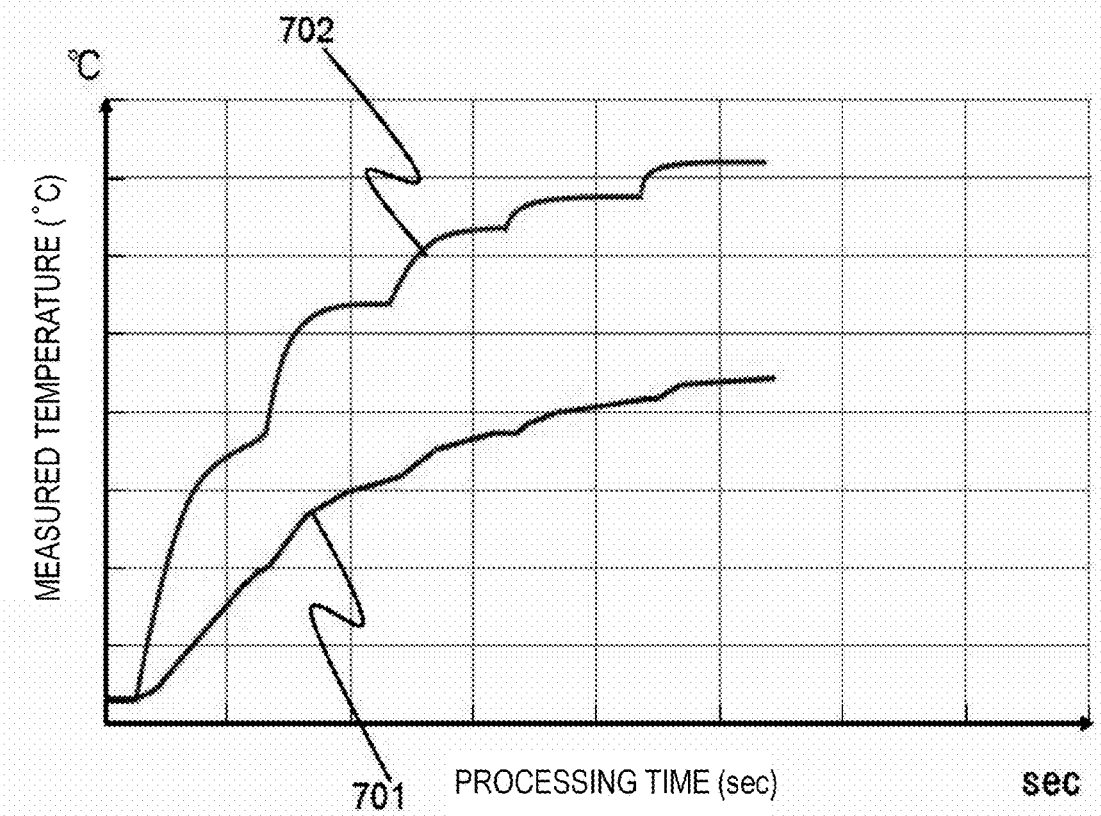
FIG. 7 is a diagram illustrating a transition of temperatures of the heat insulating plate and the target substrate, which are measured in the first embodiment of the present disclosure, with respect to time.

In addition, by using linear interpolation or linear expression approximation from the data of the time transition graph 702 of the temperature of the target wafer 603 and the time transition graph 701 of the temperature of the heat insulating plate 101a illustrated in FIG. 7, the correlation between the heat insulating plate and the target wafer, in which a vertical axis is the temperature of the target wafer and a horizontal axis is the temperature of the heat insulating plate as illustrated in FIG. 8, is stored in the memory device 121c. In this way, the temperature conversion graph creating process is completed.

(4) Effects of the Present Embodiment

According to the present embodiment, one or more effects to be described later are exhibited.

(a) By storing the correlation between the heat insulating plate having a material different from the product wafer and the target wafer having thermal characteristics similar to the product wafer, the temperature of the wafer can be estimated from the temperature of the heat insulating plate, and it is possible to easily perform the temperature control during the substrate processing.

(b) Since the temperature of the wafer can be estimated from the temperature of the heat insulating date, it is enough to measure the temperature of the heat insulating plate at the time of the wafer processing, and thus the installation location of the temperature sensor can be easily determined.

(c) Since the temperature of the heat insulating plate and the temperature of the target wafer are measured by using a non-contact type thermometer such as a radiation thermometer, it is possible to prevent the thermometer itself from being affected by the microwaves, and accurate temperature measurement is possible.

(d) Since the microwave oscillators are controlled in the combination of the pulse control and the power limit control when the temperature of the wafer is increased, it is possible to suppress the temperature difference between the microwave concentrated region and the other wafer regions from increasing in the in-plane of the wafer. In addition, it is possible to suppress the occurrence of deformation such as warping, distortion, cracking, or the like in the wafer. Furthermore, it is possible to efficiently increase the temperature of the wafer, and it is possible to heat the wafer to a desired substrate processing temperature in a short time.

(e) Since the microwave oscillators are controlled in combination of the feedback control and the pulse control when the wafer reaches the processing temperature, it is possible to maintain the temperature of the wafer at a substrate processing temperature in a predetermined range.

(f) By controlling the pulse width of pulse control, an accurate temperature control can be performed both during the wafer temperature rise and during the wafer processing.

(5) Modification of First Embodiment

The substrate processing apparatus according to the present embodiment is not limited to the above-described aspect, and the following modifications can be made.

(Modification 1)

As illustrated in FIG. 9, in modification 1, as the installation position of the non-contact type temperature sensor 263 such as the radiation thermometer is deviated outward in the radial direction from the center, the shape of the hole 217b of the ceiling plate of the boat 217 is configured to be a C-shaped groove 217c.

With this configuration, it is possible to prevent the substrate temperature from decreasing due to heat radiation from the boat ceiling plate, as compared with a case where the hole diameter of the hole 217b is enlarged.

(Modification 2)

Figure 10:
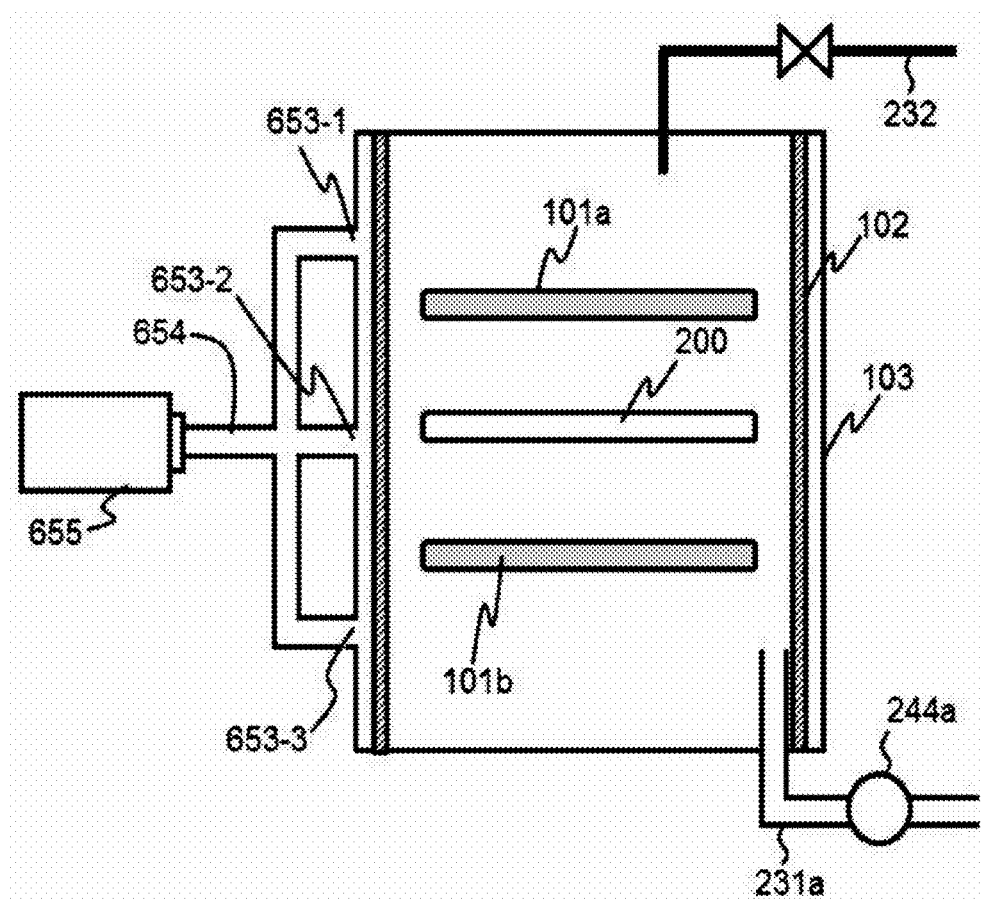
FIG. 10 is a diagram illustrating modification 2 of the first embodiment of the present disclosure.

As illustrated in FIG. 10, in modification 2, the waveguide 654 connected to one microwave oscillator 655 is branched and connected to the case 102 in plurality such that a plurality of electromagnetic wave supply ports 653-1 to 653-3 are provided in the case 102. With this configuration, the microwaves supplied from each of the plurality of electromagnetic wave supply ports 653-1 to 653-3 are uniformly emitted On the wafer 200, such that the wafer 200 can be uniformly heated.

<Second Embodiment of the Present Disclosure>

Next, a second embodiment of the present disclosure will be described with reference to FIG. 11 and FIGS. 13A to 13D.

(6) Configuration of Substrate Processing Apparatus

In the second embodiment, a substrate processing apparatus according to the present disclosure is configured as a batch-type vertical heat treatment apparatus that performs various heat treatments on wafers. In the present embodiment, the same reference numerals are assigned to components having the same functions as those in the first embodiment, and the description thereof is omitted.

(Process Chamber)

Figure 11:
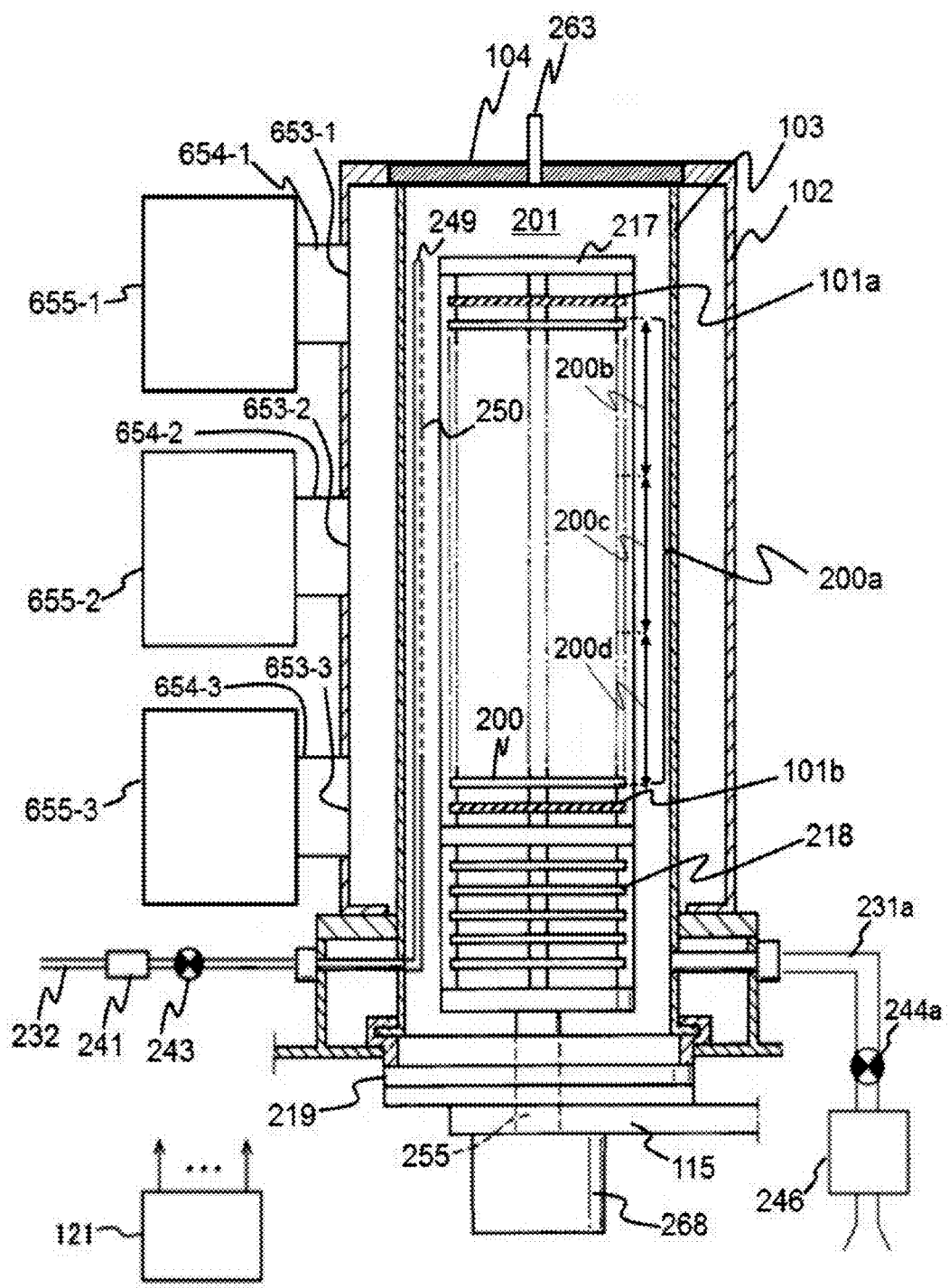
FIG. 11 is a schematic configuration diagram of a vertical process furnace of a substrate processing apparatus that is suitably used in a second embodiment of the present disclosure, and is a view illustrating the process furnace portion by a longitudinal sectional view.

As illustrated in FIG. 11, the process chamber 201 is configured such that wafers 200 as substrates can be accommodated in a state of being vertically aligned in a horizontal posture and in multiple stages by a boat 217 to be described later.

(Gas Supply Portion)

In the process chamber 201, nozzles 249 as gas supply nozzles to be described later are respectively provided so as to penetrate a lower sidewall of a reaction tube 103. The nozzles 249 are made of quartz. A gas supply pipe 232 is connected to the nozzles 249. In this manner, a reaction tube 103 is provided with the nozzles 249 and the gas supply pipe 232, and at least one type of process gas can be supplied into the process chamber 201.

However, the process chamber 201 of the present embodiment is not limited to the above-described embodiment. For example, a metal manifold for supporting the reaction tube 103 may be provided below the reaction tube 103, and each nozzle may be provided to penetrate the sidewall of the manifold. In this case, an exhaust pipe 231 may be further provided in the manifold. Even in this case, the exhaust pipe 231 may be provided not in the manifold but in the lower part of the reaction tube 103. As such, a furnace throat part of the process chamber 201 may be made of a metal, and nozzles or the like may be attached to the metal furnace throat part. In addition, a plurality of nozzles may be attached for each kind of process gas.

As in the first embodiment, an MFC 241 that is a flow rate controller (flow rate control portion) and a valve 243 that is an on-off valve are provided in the gas supply pipe 232 in this order from the upstream direction.

The nozzle 249 is connected to the tip portion of the gas supply pipe 232. The nozzles 249 are provided along the upper part from the lower part of the inner wall of the reaction tube 103 in an annular space between the inner wall of the reaction tube 103 and the wafers 200 so as to rise upward in an arranging direction of the wafers 200. That is, the nozzles 249 are respectively provided along a wafer arrangement region 200a in a region horizontally surrounding a wafer arrangement region 200a on the side of the wafer arrangement region 200a in which the wafers 200 are arranged. In other words, the nozzle 249 is provided vertically to the surface (flat surface) of the wafer 200 at the side of the edge (periphery) of the wafer 200 loaded into the process chamber 201. The nozzle 249 is configured as an L-shaped long nozzle. A horizontal portion of the nozzle 249 is provided so as to penetrate the lower sidewall of the reaction tube 103, and a vertical portion thereof is provided so as to rise from at least one end side of the wafer arrangement region 200a toward the other end side of the wafer arrangement region 200a. A plurality of gas supply holes 250 configured to supply gases are provided on the side surfaces of the nozzles 249. The gas supply hole 250 is opened to face the center of the reaction tube 103 such that the gases are supplied toward the wafers 200. A plurality of gas supply holes 250 are provided from the lower part to the upper part of the reaction tube 103 such that the plurality of gas supply holes 250 have the same opening area and are provided at the same opening pitch.

As such, in the present embodiment, the gas is carried through the nozzles 249 disposed in the annular elongated space, that is, the cylindrical space, which is defined by the inner wall of the sidewall of the reaction tube 103 and the ends (peripheries) of the plurality of stacked wafers 200. A gas is ejected from the gas supply hole 250 opened in the nozzle 249 to the reaction tube 103 for the first time in the vicinity of the wafer 200. A main flow of the gas in the reaction tube 103 is a direction parallel to the surface of the wafer 200, that is, a horizontal direction. With this configuration, it is possible to uniformly supply the inert gas such as a cooling gas or a purge gas to each wafer 200 and to improve the film thickness uniformity of the thin film formed on each wafer 200. A gas flowing on the surface of the wafer 200, that is, a gas remaining after reaction, flows in a direction of an exhaust port, that is, an exhaust pipe 231 to be described later. However, the direction of the flow of the remaining gas is appropriately specified according to the position of the exhaust port and is not limited to a vertical direction.

From the gas supply pipe 232, for example, a nitrogen ($N_2$) gas as an inert gas is supplied into the process chamber 201 through the MFC 241, the valve 243, the gas supply pipe 232, and the nozzle 249. An inert gas supply system is configured by, mainly, the gas supply pipe 232, the MFC 241, and the valve 243. The inert gas supply system can also be referred to as a purge gas supply system or a cooling gas supply system.

In addition to the $N_2$ gas, a rare gas, such as an Ar gas, a He gas, a Ne gas, or a Xe gas can also be used as the inert gas.

(Exhaust Portion)

On the sidewall of the reaction tube 103, an exhaust pipe 231 and a pressure regulator 244 such as an APC valve are provided as an exhaust portion. A vacuum pump 246 may be included in the exhaust portion as in the first embodiment.

(Microwave Oscillator)

A plurality of electromagnetic wave introduction ports 653-1 to 653-3 are respectively installed vertically on the sidewall of the case 102. One ends of the waveguides 654-1 to 654-3 are respectively connected to the electromagnetic wave introduction ports 653-1 to 653-3. Microwave oscillators 655-1 to 655-3 are respectively connected to the other ends of the waveguides 654-1 to 654-3.

With this configuration, it is possible to uniformly heat the wafers 200 held in multiple stages in a vertical direction, and it is possible to improve the inter-plane uniformity of the wafers 200.

In addition, as in the first embodiment, the microwave oscillators 655-1 to 655-3 are respectively connected to the controller 121 and are controlled by the same control signal transmitted from the controller 121. However, the present disclosure is not limited thereto, and the microwave oscillators 655-1 to 655-3 may be individually controlled by transmitting individual control signals from the controller 121 to each of the microwave oscillators 655-1 to 655-3. Furthermore, the microwave oscillators 655-1 to 655-3 may be controlled by a predetermined combination (grouping). For example, the microwave oscillators 655-1 and 655-2 are controlled by the same control signal, and the microwave oscillator 655-3 is controlled by an individual control signal.

(Peripheral Mechanism)

Below the reaction tube 103, a seal cap 219 is provided as a furnace throat lid that can airtightly close the lower end opening of the reaction tube 103. The seal cap 219 is configured to be brought into contact with the lower end of the reaction tube 103 from a vertically lower side. The seal cap 219 is made of, for example, a metal such as stainless steel (SUS) and is formed to have a disk shape. On the top surface of the seal cap 219, an O-ring is provided as a seal member that is brought into contact with the lower end of the reaction tube 103. A rotation mechanism 268 that rotates a boat 217 to be described later is provided at the side of the seal cap 219 opposite to the process chamber 201. A shaft 255 of the rotation mechanism 268 passes through the seal cap 219 and is connected to the boat 217. The rotation mechanism 268 is configured to rotate the wafers 200 by rotating the boat 217. The seal cap 219 is configured such that the seal cap 219 is moved upward and downward by a boat elevator 115 serving as an elevation mechanism that is vertically provided outside the reaction tube 103. The boat elevator 115 is configured to load the boat 217 into the process chamber 201 or unload the boat 217 from the process chamber 201 by moving the seal cap 219 upward or downward. That is, the boat elevator 115 is configured as a transfer device (transfer mechanism) that transfers the boat 217, that is, the wafers 200, to the inside or the outside of the process chamber 201.

(Substrate Holder)

The boat 217 serving as a substrate holder is configured such that a plurality of sheets of wafers 200, for example, 25 to 200 wafers, are vertically aligned and supported in a horizontal posture, with their centers aligned with one another, in multiple stages, that is, arranged spaced apart from one another at predetermined intervals. In addition, a heat insulating plate 101a is held above the uppermost wafer 200 held by the boat 217, and a heat insulating plate 101b is held below the lowermost wafer 200. The boat 217 is made of, for example, a heat resistant material such as quartz or SiC. A heat insulating plate 218 made of, for example, a heat resistant material such as quartz or SiC may be supported in multiple stages in a horizontal posture below the boat 217, or a heat insulating cylinder configured as a cylindrical member made of a heat resistant material such as quartz or SiC may be provided without providing heat insulating plate 218 below the boat 217. With this configuration, heat from the substrate 200 or the quartz susceptor 101b is hardly transmitted to the furnace throat side. In addition, as in the first embodiment, the hole 217b serving as the measurement window of the temperature sensor 263 is provided in the end plate (ceiling plate) 217a of the boat 217, and the heat insulating plate 101a is held in the boat 217 such that the temperature sensor 263 measures the surface temperature of the heat insulating plate 101a.

(7) Substrate Processing Process

The substrate processing process as one of the processes of manufacturing the semiconductor device by using the substrate processing apparatus in the second embodiment described above is the same as that in the substrate processing process in the first embodiment, except for a temperature conversion graph creating process S302' to be described in detail later. That is, in the present embodiment, the substrate processing is performed in the order of a temperature conversion graph creating process S302', a loading process S304, a pressure adjusting process S306, an inert gas supplying process S308, a reforming process S310, an atmospheric pressure returning process S312, and an unloading process S314.

(8) Temperature Conversion Graph Creating Process

Next, the detailed processing flow of the temperature conversion graph creating process S302 will be described with reference to FIGS. 12 and 13A to 13D.

(Heat Insulating Plate Temperature Measurement (S1202))

Figure 13A:
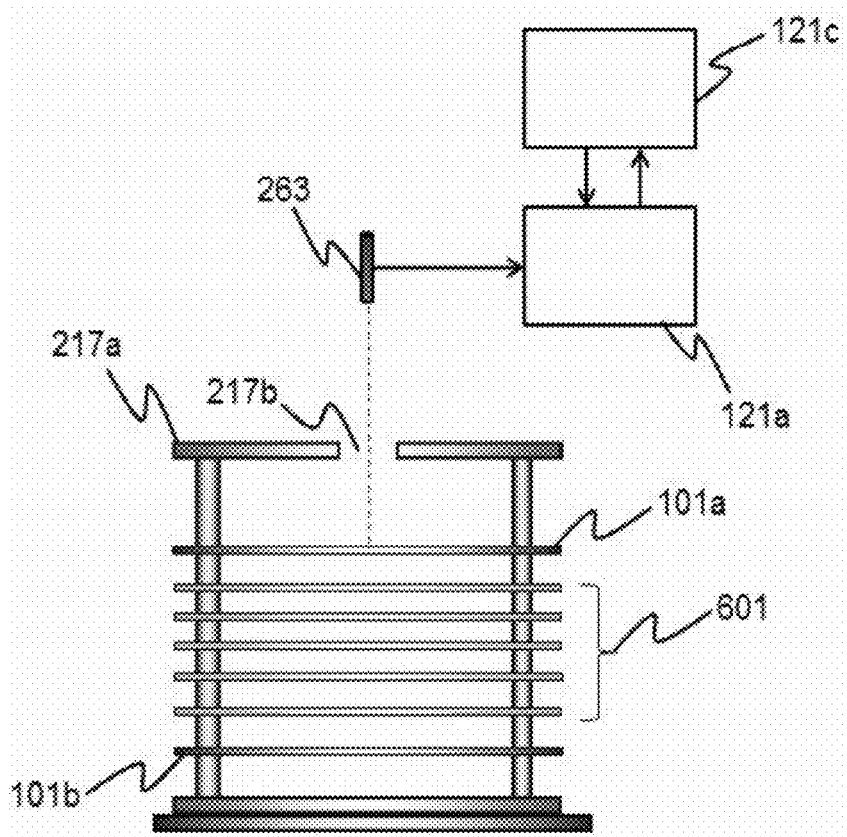
FIG. 13A is a diagram illustrating a temperature measuring method when creating a process conversion table that is suitably used in the second embodiment of the present disclosure, and is a diagram when a temperature of a heat insulating plate is measured.

As illustrated in FIG. 13A, the heat insulating plate temperature measurement flow is the same as in the first embodiment. That is, the heat insulating plate temperature measurement S1202 acquires data by performing the same processing as in the first embodiment in the order of the heat insulating plate measurement preparation and loading process S502, the temperature adjustment and heat insulating plate temperature measurement S504, the data acquisition determination S506, and the unloading process S508. At this time, as illustrated in FIG. 13A, dummy wafers 601 are vertically held in multiple stages in the wafer arrangement region 200a of the boat 217.

(Target Substrate Measurement Preparation and Loading Process (S1204))

Figure 13B:
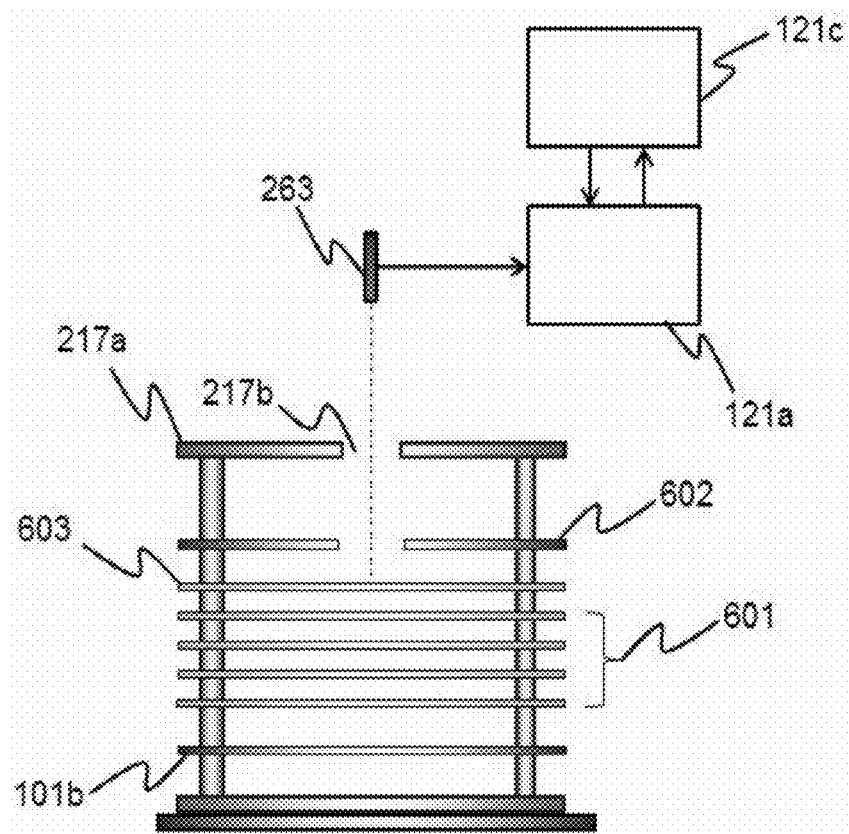
FIG. 13B is a diagram illustrating a temperature measuring method when creating a process conversion table that is suitably used in the second embodiment of the present disclosure, and is a diagram when a temperature of a target substrate placed at an upper height is measured.

When the boat 217 is unloaded, the heat insulating plate 101a is taken out from the boat 217 as illustrated in FIG. 13B, and the perforated heat insulating plate 602 is held at the position where the heat insulating plate 101a was held. Similarly, after the dummy wafer 601 is unloaded, the target wafer 603 made of a material having thermal characteristics more similar to the product wafer than the dummy wafer is held on the uppermost part of the wafer arrangement region 200a of the boat 217 or in the top region (TOP part) 200b that is an upper one-third length region when the length of the wafer arrangement region 200a in a longitudinal direction is divided into three equal parts. The dummy wafer 601 is held in the wafer arrangement region 200a other than the target wafer 603. When the dummy wafer 601, the perforated heat insulating plate 602, and the target wafer 603 are respectively held at the predetermined positions of the boat 217, the boat 217 is loaded into the process chamber 201 (S1204).

(Temperature Adjustment and Target Substrate Temperature Measurement (S1206))

As in the first embodiment, when the boat 217 in which the dummy wafer 601, the perforated heat insulating plate 602, and the target wafer 603 are held is loaded into a predetermined substrate processing position, the microwave is supplied from the microwave oscillator 655, and the temperature adjustment such as the increase in the temperature of wafer 200 up to the substrate processing temperature and the temperature maintenance. While the temperature adjustment is performed, the surface temperature of the target wafer 603 is measured for a predetermined time by the temperature sensor 263 at a predetermined start timing (S1206).

(Data Acquisition Completion Determination (S1208))

As in the first embodiment, when the temperature sensor 263 measures the temperature of the target wafer 603 for a predetermined time, the controller 121 determines whether predetermined data can be acquired (S1208). If the acquisition of the predetermined data is completed, the process proceeds to a next step, and if not completed, the temperature adjustment and target substrate temperature measurement S1206 is performed again.

(Unloading Process (S1210))

When the temperature data of the target wafer 603 held in the uppermost part of the wafer arrangement region 200a or the upper region 200b can be acquired, the boat 217 is unloaded (S1210).

(Target Substrate Temperature Measurement Completion Determination (S1212))

When the boat 217 is unloaded in the unloading process S1210, it is determined whether the temperature measurement of the target wafer 603 has been completed for a predetermined number of sheets. If the acquisition of data for the predetermined number of sheets is completed, the process proceeds to a next step, and if not completed, the temperature adjustment and target substrate temperature measurement S1204' or S1204" is performed.

(Target Substrate Measurement Preparation and Loading Process (S1204', S1204"))

Figure 13C:
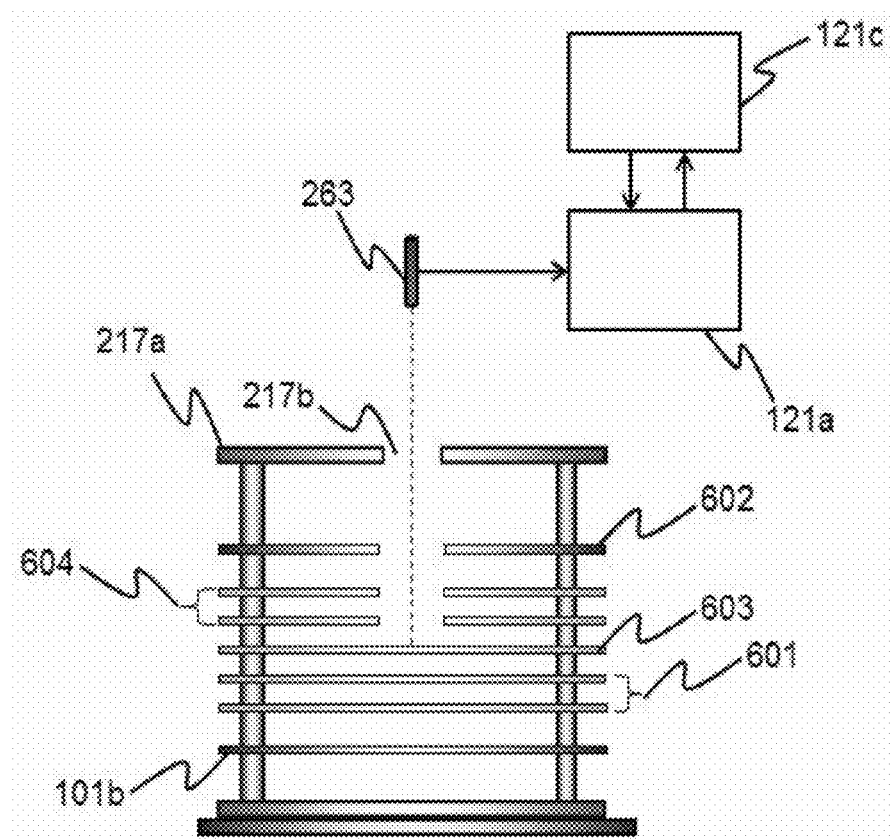
FIG. 13C is a diagram illustrating a temperature measuring method when creating a process conversion table that is suitably used in the second embodiment of the present disclosure, and is a diagram when a temperature of a target substrate placed at substantially a middle height is measured.

When it is determined from the determination of the target substrate temperature measurement completion determination S1212 that the temperature measurement of the target wafer 603 has not been completed for the predetermined number of sheets, a preparation for a next target substrate measurement is performed. As illustrated in FIG. 13C, the target wafer 603 that is a temperature measurement target is held in the middle part of the wafer arrangement region 200a of the boat 217 or the middle region (middle part) 200c that is a middle ⅓ length region when the length of the wafer arrangement region 200a in a longitudinal direction is divided into three equal parts. A perforated dummy wafer 604 having a hole opened at the same position as the perforated heat insulating plate in a vertical direction is held in the wafer arrangement region 200a above the target wafer 603, and the dummy wafer 601 is held in the wafer arrangement region 200a below the target wafer 603. When the dummy wafer 601, the perforated heat insulating plate 602, the target wafer 603, and the perforated dummy wafer 604 are respectively held at the predetermined positions of the boat 217, the boat 217 is loaded into the process chamber 201 (S1204').

The subsequent process is the same as the process subsequent to the target substrate measurement preparation and loading process S1204.

Figure 13D:
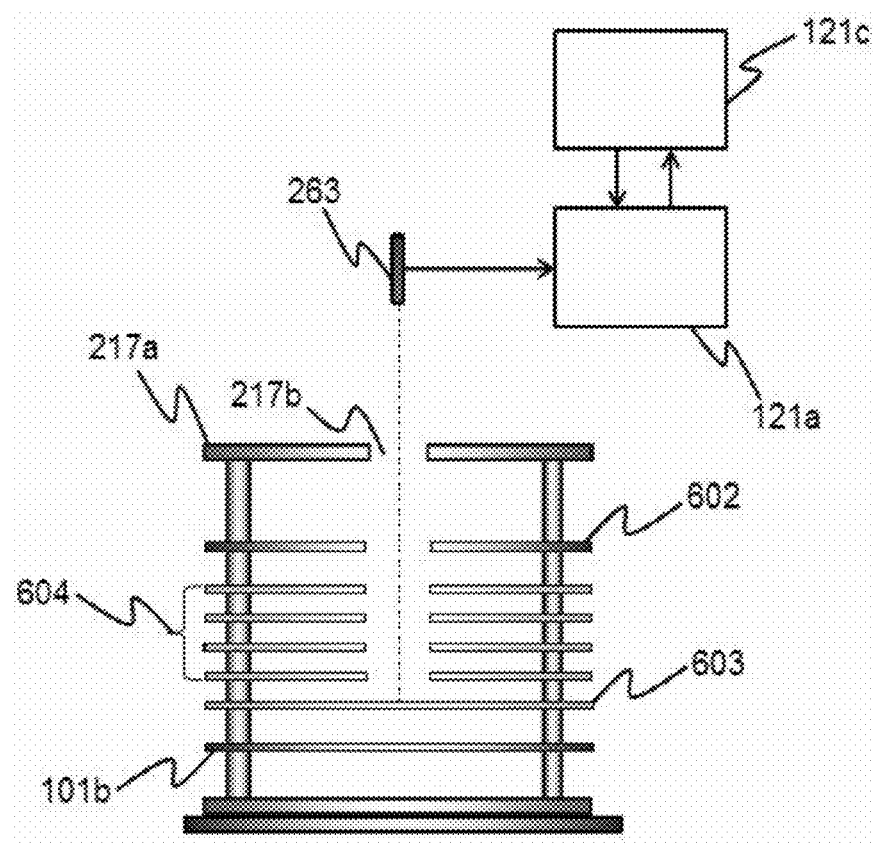
FIG. 13D is a diagram illustrating a temperature measuring method when creating a process conversion table that is suitably used in the second embodiment of the present disclosure, and is a diagram when a temperature of a target substrate placed at a lower height is measured.

As in the target substrate measurement preparation and loading process S1204', a target substrate measurement preparation and loading process S1204" is performed. That is, as illustrated in FIG. 13D, the target wafer 603 that a temperature measurement target is held in the lowermost part of the wafer arrangement region 200a of the boat 217 or the bottom region (bottom part) 200d that is a lower ⅓ length region when the length of the wafer arrangement region 200a in a longitudinal direction is divided into three equal parts. The Perforated dummy wafer 604 is held in the wafer arrangement region 200a above the target wafer. When the perforated heat insulating plate 602, the target wafer 603, and the perforated dummy wafer 604 are respectively held at the predetermined positions of the boat 217, the boat 217 is loaded into the process chamber 201 (S1204"). The subsequent process is the same as the process subsequent to the target substrate measurement preparation and loading processes S1204 and S1204'.

It should be noted that the target substrate measurement preparation and loading process S1204' and S1204" can also be shifted to the next step without being particularly performed, but it is possible to execute a detailed temperature control even in the vertical direction and to improve the inter-plane temperature uniformity of the wafer 200 by performing these processes.

(Unloading Process, Substrate Processing Preparation, and Temperature Conversion Graph Creation (S1214))

When it is determined from the determination of the target substrate temperature measurement completion determination S1212 that the temperature measurement of the target wafer 603 has been completed for the predetermined number of sheets, the boat 217 is unloaded. After the boat 217 is unloaded, the perforated heat insulating plate 602 is taken out, and the heat insulating plate 101a is placed on the boat 217 as illustrated in FIG. 11. In addition, the target wafer 603 is taken out and the normal wafer 200 is placed on the boat 217. In this way, the preparation for executing the substrate processing flow is performed. From data on a time transition between the temperature of each of the target wafers 603 held at different positions of height and the temperature of the heat insulating plate 101a, a correlation between the heat insulating plate and the target wafer, in which a vertical axis represents the temperature of the heat insulating plate and a horizontal axis represents the temperature of the target wafer is stored in the memory device 121c (S1216). In this way, the temperature conversion graph creating process is completed.

(9) Effects of the Present Embodiment

According to the present embodiment, It is possible to obtain the same effects as those of the first embodiment, and it is possible to obtain one or more of the following effects.

(g) It is possible to accurately perform the temperature control of wafers held in multiple stages by holding the target wafers as temperature measurement targets at different positions of height and performing the temperature measurement, and it is possible to improve the inter-plane temperature uniformity of the wafers.

Although the present disclosure has been described according to the embodiments, each of the above-described embodiments, each of the modifications, and the like can be combined as appropriate and the effects thereof can also be obtained.

For example, in each of the above-described embodiments, the temperature conversion graph creating process has been described, but the present disclosure is not limited thereto. A temperature conversion list may be created instead of the temperature conversion graph.

In addition, for example, in each of the above-described embodiments, the process of reforming the amorphous silicon film into the polysilicon film as the film including silicon as the main component has been described, but the present disclosure is not limited thereto. A film formed on the surface of the wafer 200 may be reformed by supplying a gas including at least one of oxygen (O), nitrogen (N), carbon (C) and hydrogen (H). For example, in a case where a hafnium oxide film (HfxOy film) as a high-dielectric-constant film is formed on the wafer 200, deficient oxygen in the hafnium oxide film is supplemented by supplying the microwave while supplying the oxygen-containing gas and heating the oxygen-containing gas, thereby improving characteristics of the high-dielectric-constant film, and an uncrystallized portion in the hafnium oxide film is crystallized by supplying the microwave while supplying the nitrogen gas ($N_2$ gas) and heating the nitrogen gas, thereby improving characteristics of the high-dielectric-constant film. Although the hafnium oxide film is shown here, the present disclosure is not limited to the hafnium oxide film. The present disclosure can be preferably applied to the case of forming a metal-based oxide film, that is, an oxide film including at least one metal element of aluminum (Al), titanium (Ti), zirconium (Zr), tantalum (Ta), niobium (Nb), lanthanum (La), cerium (Ce) yttrium (Y), barium (Ba), strontium (Sr), calcium (Ca), lead (Pb), molybdenum (Mo), and tungsten (W). That is, the above-described film forming sequence can also be preferably applied to the case of forming, on the wafer 200, a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, a NbOC film, a NbON film, a NbO film, an AlOCN film, an AlOC film, an AlON film, an AlO film, a MoOCN film, a MoOG film, a MoON film, a MoO film, a WOCN film, a WOC film, a WON film, or a WO film.

In addition, the present disclosure is not limited to the high-dielectric-constant film, a film including silicon doped with impurities as a main component may be heated. As the film including silicon as the main component, there are a Si-based oxide film such as a silicon nitride film (SiN film), a silicon oxide film (SiO film), a silicon oxycarbide film (SiOC film), a silicon oxycarbonitride film (SiOCN film), or a silicon oxynitride film (SiON film), an epitaxial silicon film (Epi-Si film), an epitaxial silicon germanium film (Epi-SiGe film), and the like. Examples of the impurities include at least one of bromine (B), carbon (C), nitrogen (N), aluminum (Al), phosphorus (P), gallium (Ga), and arsenic (As). In addition to the film including silicon as the main component or the metal oxide film described above, an epitaxial germanium film (Epi-Ge film) or a film formed using a group 3-5 element may be heated.

In addition, it may be a resist film based on at least one of a methyl methacrylate resin (polymethylmethacrviate (PMMA)), an epoxy resin, a novolac resin, and a polyvinyl phenyl resin.

In addition, one of the processes of manufacturing the semiconductor device has been described above, but the present disclosure is not limited thereto. The present disclosure can also be applied to substrate processing technology such as a patterning process of a liquid crystal panel manufacturing process, a patterning process of a solar cell manufacturing process, or a patterning process of a power device manufacturing process.

INDUSTRIAL APPLICABILITY

As described above, the present disclosure can provide a technology that enables uniform substrate processing.

The invention claimed is:

1. A method of manufacturing a semiconductor device, the method comprising:
    heating a heat insulating plate, which is held by a substrate holder configured to hold a substrate, to a processing temperature, at which the substrate is processed, by an electromagnetic wave supplied from a heating device, and measuring a temperature change of the heat insulating plate by a non-contact type thermometer until the heat insulating plate reaches the processing temperature;
    heating the substrate, which is held by the substrate holder, to the processing temperature by the heating device, and measuring a temperature change of the substrate by the non-contact type thermometer until the substrate reaches the processing temperature;
    obtaining a correlation between the temperature change of the heat insulating plate and the temperature change of the substrate according to a measurement result of the temperature change of the heat insulating plate and a measurement result of the temperature change of the substrate; and
    heating the substrate by controlling the heating device based on the temperature of the heat insulating plate measured by the non-contact type thermometer and the correlation.

2. The method according to claim 1, wherein, in the heating of the substrate, the heating device is controlled in a combination of pulse control for intermittently supplying the electromagnetic wave in a period of heating the substrate and increasing the temperature and power limit control for linearly controlling a supply output of the electromagnetic wave.

3. The method according to claim 1, wherein, in the heating of the substrate, the heating device is controlled in a combination of pulse control for intermittently supplying the electromagnetic wave and feedback control for controlling the heating device based on the correlation, in a period of being maintained at the processing temperature.

4. The method according to claim 1, wherein, in the measuring of the temperature change of the heat insulating plate, the heat insulating plate is held above or below the substrate, and the temperature change is measured.

5. The method according to claim 1, wherein, in the measuring of the temperature change of the substrate, the substrate, of which the temperature change is measured, is held in an upper region of a substrate holding region of the substrate holder.

6. The method according to claim 5, wherein, in the measuring of the temperature change of the substrate, the substrate, of which the temperature change is measured, is further held in a middle region of the substrate holding region of the substrate holder.

7. The method according to claim 6, wherein, in the measuring of the temperature change of the substrate, the substrate, of which the temperature change is measured, is further held in a bottom region of the substrate holding region of the substrate holder.

8. The method according to claim 1, wherein at least two electromagnetic wave oscillators configured to oscillate the electromagnetic wave are provided in the heating device, and the same control is performed based on a result measured by the non-contact type thermometer.

9. The method according to claim 1, wherein the non-contact type thermometer is a radiation thermometer.

10. The method according to claim 1, wherein two or more heat insulating plates are held so as to sandwich at least the substrate therebetween.

11. The method according to claim 1, wherein, in the measuring of the temperature change of the heat insulating plate, two or more heat insulating plates are held so as to sandwich at least the substrate therebetween, and the temperature is measured by the non-contact type thermometer.

12. The method according to claim 1, wherein, in the measuring of the temperature change of the substrate, the substrate is held so as to be sandwiched by at least two or more heat insulating plates, and the temperature is measured by the non-contact type thermometer.

13. The method according to claim 12, wherein, in the heating of the substrate, the substrate is held so as to be sandwiched by at least two or more heat insulating plates, and is heated by the heating device.

* * * * *